(12) United States Patent
Naka

(10) Patent No.: US 10,838,022 B2
(45) Date of Patent: Nov. 17, 2020

(54) ROTATIONAL MANIPULATION DETECTOR AND LENS BARREL

(71) Applicant: Panasonic Intellectual Property Management Co., Ltd., Osaka (JP)

(72) Inventor: Yoshio Naka, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 47 days.

(21) Appl. No.: 16/112,716

(22) Filed: Aug. 26, 2018

(65) Prior Publication Data

US 2019/0072619 A1 Mar. 7, 2019

(30) Foreign Application Priority Data

Sep. 1, 2017 (JP) .................................. 2017-168529
Jun. 25, 2018 (JP) .................................. 2018-119596

(51) Int. Cl.
| | | |
|---|---|---|
| *G01R 33/07* | (2006.01) | |
| *G01D 5/14* | (2006.01) | |
| *G01P 3/488* | (2006.01) | |
| *G01P 3/487* | (2006.01) | |
| *G02B 7/105* | (2006.01) | |
| *G06F 3/01* | (2006.01) | |

(Continued)

(52) U.S. Cl.
CPC .......... *G01R 33/072* (2013.01); *G01D 5/147* (2013.01); *G02B 7/08* (2013.01); *G02B 7/105* (2013.01); *G06F 3/016* (2013.01); *G06F 3/0362* (2013.01); *G01P 3/487* (2013.01); *G01P 3/488* (2013.01)

(58) Field of Classification Search
CPC ............................. G01D 5/147; G01D 5/3473
See application file for complete search history.

(56) References Cited

U.S. PATENT DOCUMENTS 4,785,242 A * 11/1988 Vaidya .................. G01D 5/147
310/68 B
5,781,005 A * 7/1998 Vig ........................ G01D 5/147
324/207.2
(Continued)

FOREIGN PATENT DOCUMENTS

| JP | 5-66133 | 3/1993 |
| JP | 7-333236 | 12/1995 |

(Continued)

*Primary Examiner* — Noam Reisner
(74) *Attorney, Agent, or Firm* — Renner, Otto, Boisselle & Sklar, LLP

(57) ABSTRACT

A rotational manipulation detector includes: a magnetic material in the shape of a ring and including, disposed alternately in the circumferential direction of the magnetic material, first magnetic portions each having a first cross-sectional area in the circumferential direction and second magnetic portions each having, in the circumferential direction, a second cross-sectional area different from the first cross-sectional area; a first magnet disposed opposite to the magnetic material; and a first Hall element and a second Hall element which are disposed opposite to the magnetic material and detect a change in a magnetic field which occurs when the magnetic material is rotated. The first magnet, the first Hall element, and the second Hall element are disposed side by side along the circumferential direction of the magnetic material.

7 Claims, 18 Drawing Sheets

(51) Int. Cl.
*G06F 3/0362* (2013.01)
*G02B 7/08* (2006.01)

(56) References Cited

U.S. PATENT DOCUMENTS

| | | | | |
|---|---|---|---|---|
| 6,104,186 | A * | 8/2000 | Yamada | F02P 7/07 |
| | | | | 324/174 |
| 2003/0117132 | A1 * | 6/2003 | Klinghult | G01D 5/147 |
| | | | | 324/207.25 |
| 2004/0189285 | A1 * | 9/2004 | Uenoyama | G01D 5/147 |
| | | | | 324/207.12 |
| 2009/0256552 | A1 | 10/2009 | Guo | |
| 2014/0307161 | A1 * | 10/2014 | Park | H04N 5/23241 |
| | | | | 348/372 |
| 2016/0291287 | A1 | 10/2016 | Kishida | |

FOREIGN PATENT DOCUMENTS

| | | |
|---|---|---|
| JP | 2009-250984 | 10/2009 |
| JP | 2016-191908 | 11/2016 |
| JP | 2016-194731 | 11/2016 |

\* cited by examiner

ROTATIONAL MANIPULATION DETECTOR AND LENS BARREL

CROSS REFERENCE TO RELATED APPLICATION

This application claims the benefit of priority of Japanese Patent Application Number 2017-168529 filed on Sep. 1, 2017 and Japanese Patent Application Number 2018-119596 filed on Jun. 25, 2018, the entire contents of which are hereby incorporated by reference.

BACKGROUND

1. Technical Field

The present disclosure relates to a rotational manipulation detector for detecting rotational manipulation of a manipulation component and to a lens barrel including the rotational manipulation detector.

2. Description of the Related Art

Imaging devices such as a digital still camera are equipped with a lens barrel. The lens barrel includes at least one focus lens disposed along the optical axis, a focus ring for adjusting the focus position by moving the focus lens along the optical axis, and a rotational manipulation detector for detecting rotational manipulation (i.e., the amount of rotation and the direction of rotation) of the focus ring.

Contact type rotational manipulation detectors that use an encoder and non-contact type rotational manipulation detectors that use a photo interrupter are known as conventional rotational manipulation detectors (see, for example, Japanese Unexamined Patent Application Publication No. 2016-194731 and Japanese Unexamined Patent Application Publication No. 2016-191908). In these types of rotational manipulation detectors, when the focus ring is rotated, the amount of rotation and the direction of rotation of the focus ring can be detected based on a detection signal outputted from the encoder or the photo interrupter.

SUMMARY

The present disclosure provides a rotational manipulation detector capable of detecting, with high resolution, rotational manipulation of a manipulation component, and a lens barrel including the rotational manipulation detector.

A rotational manipulation detector according to the present disclosure includes: a magnetic material in a shape of a ring and including first magnetic portions and second magnetic portions disposed alternately in a circumferential direction of the magnetic material, the first magnetic portions each having a first cross-sectional area in the circumferential direction, the second magnetic portions each having, in the circumferential direction, a second cross-sectional area different from the first cross-sectional area; a first magnet disposed opposite to the magnetic material; and a first magnetic sensor and a second magnetic sensor which are disposed opposite to the magnetic material and detect a change in a magnetic field which occurs when the magnetic material is rotated. The first magnet, the first magnetic sensor, and the second magnetic sensor are disposed side by side along the circumferential direction of the magnetic material.

A rotational manipulation detector according to the present disclosure is capable of detecting, with high resolution, rotational manipulation of a manipulation component.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS (Underlying Knowledge Forming the Basis of the Present Disclosure)

The inventor has found that the subsequent problems occur with regard to the techniques described in the foregoing "Description of the Related Art" section.

In a contact type rotational manipulation detector using an encoder, friction occurs in a sliding portion of a sensor that detects rotation when the focus ring is rotated, and thus product life is shortened. On the other hand, in a non-contact type rotational manipulation detector using a photo interrupter, the structure of the light-shield that is paired with the photo interrupter places a limit on the improvement of rotation amount detection resolution.

Hereinafter, embodiments are described in detail with reference to the drawings as necessary. However, there are instances where overly detailed description is omitted. For example, there are instances where detailed description of well-known matter and overlapping explanation of identical elements are omitted. This is to avoid making the subsequent description verbose so as to facilitate understanding by a person having ordinary skill in the art.

It should be noted that the appended drawings and the subsequent description are provided to enable a person having ordinary skill in the art to sufficiently understand the present disclosure, and are not intended to limit the subject matter recited in the claims.

Furthermore, in the subsequent description, the rotation axis of a ring-shaped magnetic material that rotates relative to a pair of Hall elements and permanent magnets is referred to as the Z-axis (optical axis), an arbitrary line perpendicular to the Z-axis is referred to as the X-axis, and an axis perpendicular to both the Z-axis and the X-axis is referred to as the Y-axis. Here, the direction from the magnetic material to the pair of Hall elements is referred to as the positive Z-axis direction. In addition, the circumferential direction of the magnetic material is referred to as the θ direction, and the radial direction of the magnetic material is referred to as the r direction. The direction heading radially outward from the Z-axis is referred to as the positive r direction, and the right-hand twist direction seen in the positive Z-axis direction is referred to as the positive θ direction.

Embodiment 1

Hereinafter, Embodiment 1 will be described with reference to FIG. 1 to FIG. 11.

1-1. Overall Configuration of Rotational Manipulation Detector

Figure 1:
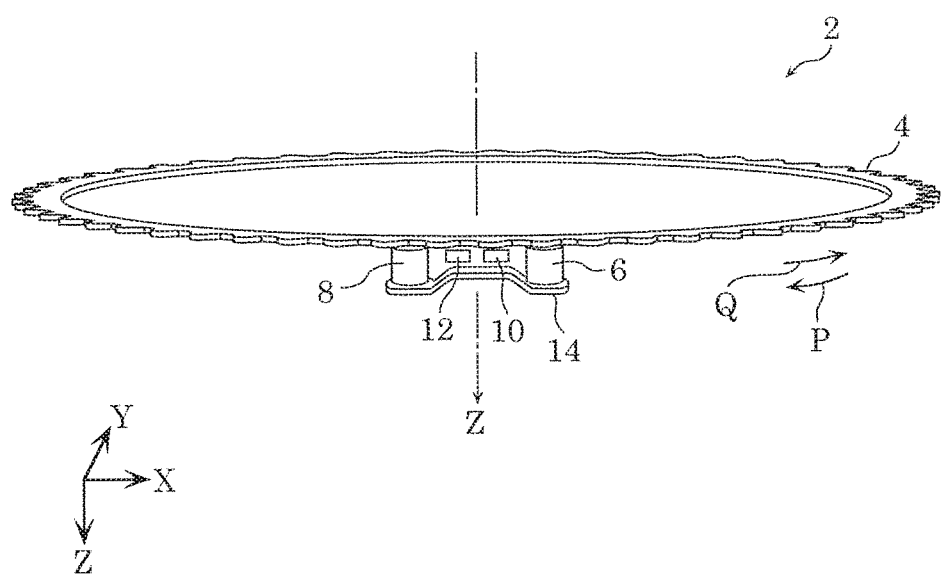
FIG. 1 is a perspective view of a rotational manipulation detector according to Embodiment 1.
Figure 2:
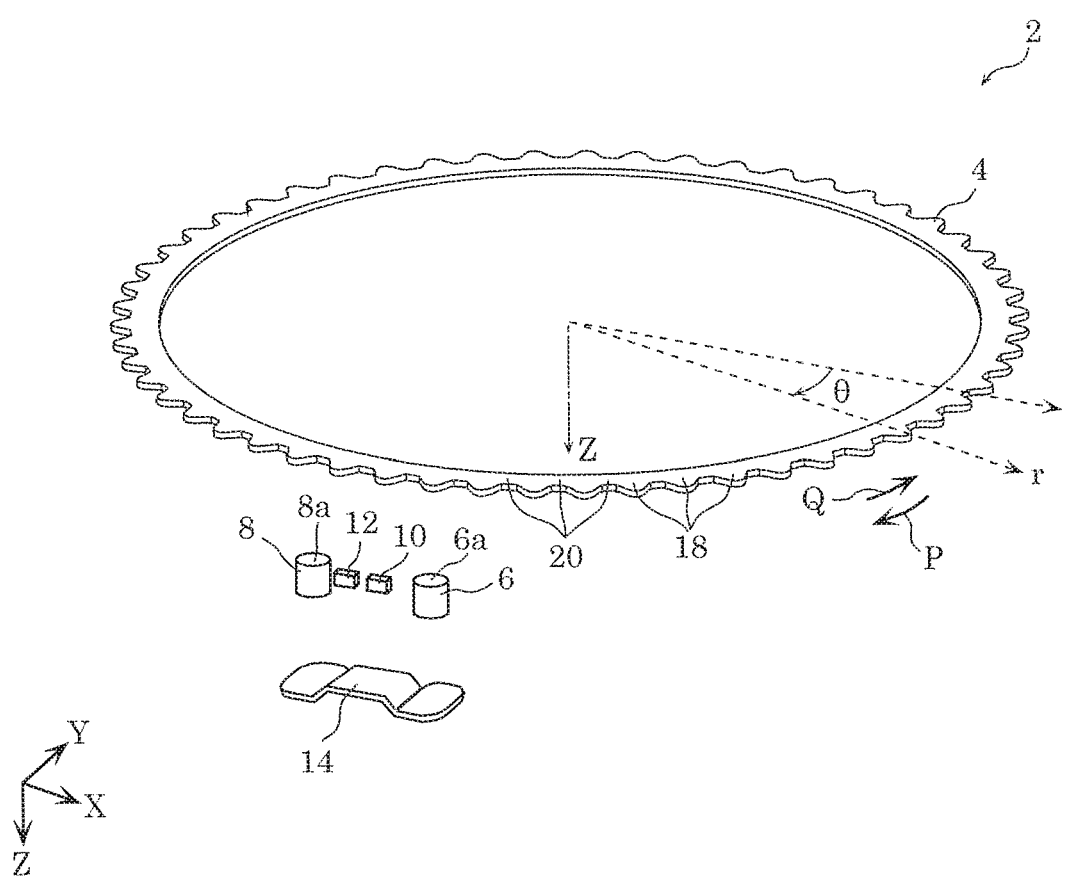
FIG. 2 is an exploded perspective view of the rotational manipulation detector according to Embodiment 1.
Figure 3A:
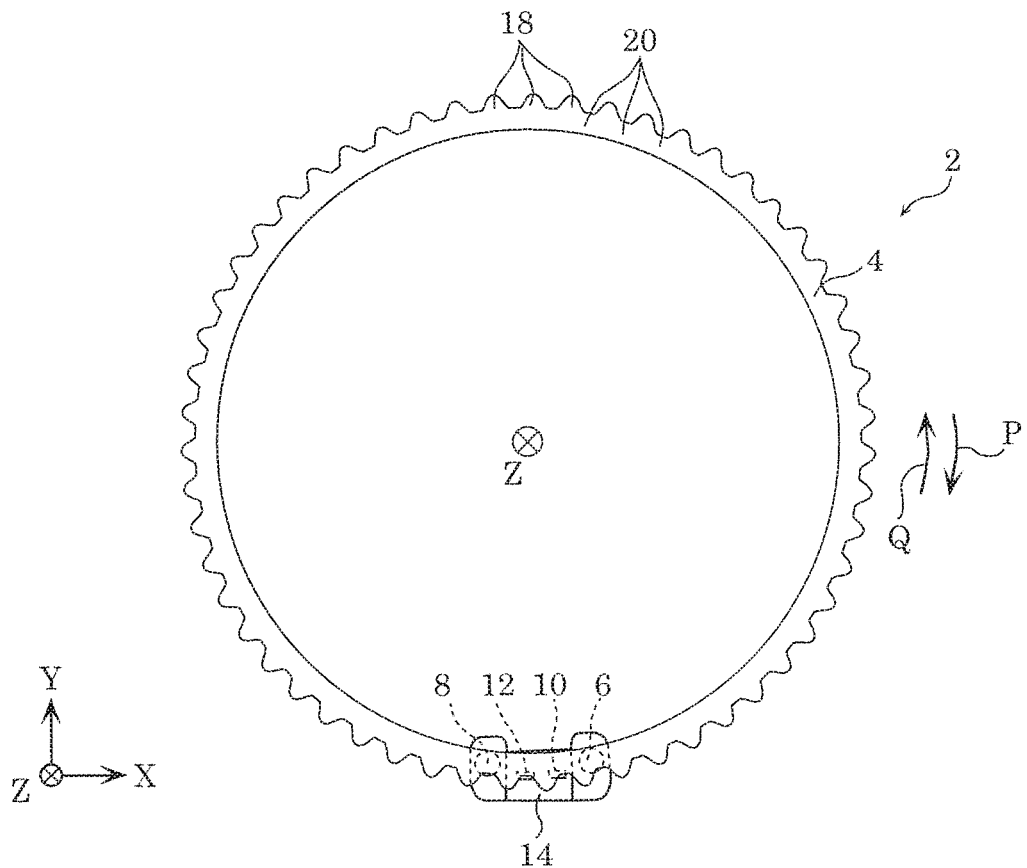
FIG. 3A is a plan view of the rotational manipulation detector according to Embodiment 1.
Figure 3B:
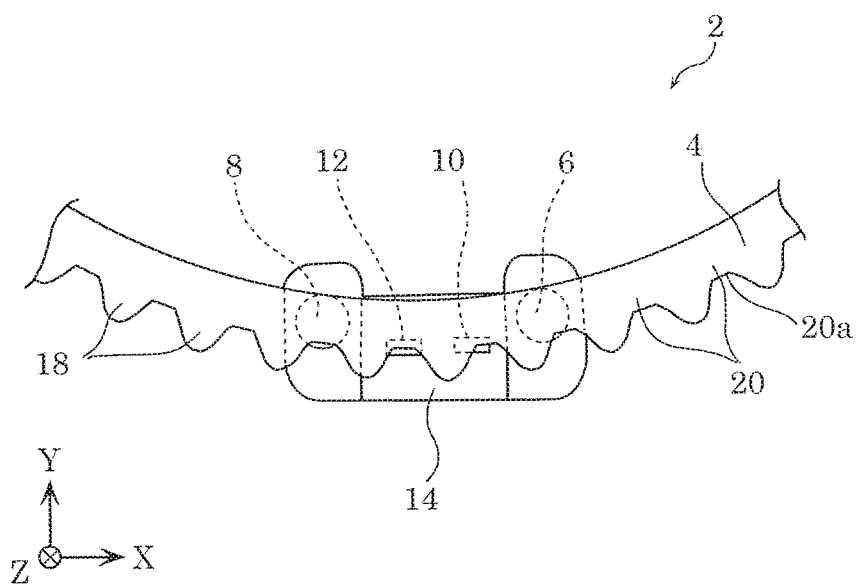
FIG. 3B is an enlarged view of main parts in FIG. 3A.
Figure 4:
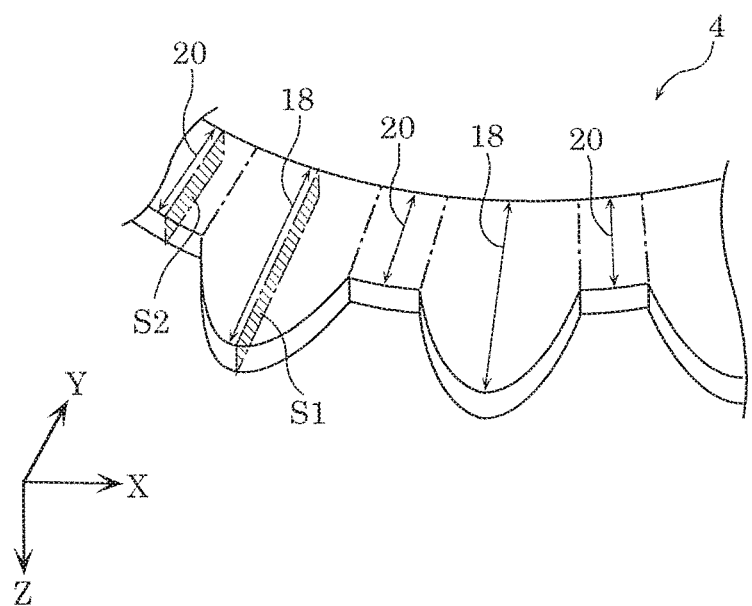
FIG. 4 is a main part perspective view illustrating an enlarged view of part of a magnetic material according to Embodiment 1.

First, the overall configuration of rotational manipulation detector 2 according to Embodiment 1 will be described with reference to FIG. 1 to FIG. 4. FIG. 1 is a perspective view of rotational manipulation detector 2 according to Embodiment 1. FIG. 2 is an exploded perspective view of rotational manipulation detector 2 according to Embodiment 1. FIG. 3A is a plan view of rotational manipulation detector 2 according to Embodiment 1. FIG. 3B is an enlarged view of main parts in FIG. 3A. FIG. 4 is a main part perspective view illustrating an enlarged view of part of magnetic material 4 according to Embodiment 1.

As illustrated in FIG. 1, rotational manipulation detector 2 is a device for detecting rotational manipulation (amount of rotation and direction of rotation) of a manipulation component. Rotational manipulation detector 2 includes magnetic material 4, first magnet 6, second magnet 8, first Hall element 10 (an example of a first magnetic sensor), second Hall element 12 (an example of a second magnetic sensor), and yoke 14.

It should be noted that the manipulation component is a component that is rotationally manipulated (rotated) by a user, and is, for example, focus ring 38 provided in lens barrel 32 of imaging device 28 (see FIG. 10 described later), or dial switch 44 provided in dashboard 40 of a vehicle, etc. (see FIG. 11 described later).

As illustrated in FIG. 1 to FIG. 3B, magnetic material 4 is a component for changing the magnetic field, and is attached to the manipulation component. Magnetic material 4 is formed into a ring-shaped plate. In this embodiment, the thickness (size in the Z-axis direction) of magnetic material 4 is less than the width in the radial direction (r direction) of magnetic material 4. Magnetic material 4 is formed using a magnetic material such as iron, for example. When the manipulation component is rotated, magnetic material 4 rotates together with the manipulation component, in the direction indicated by arrow P or arrow Q (positive θ direction or negative θ direction) with the Z-axis as the rotation axis. It should be noted that magnetic material 4 is formed, for example, by pressing sheet metal.

As illustrated in FIG. 2 to FIG. 4, a plurality of first magnetic portions 18 and a plurality of second magnetic portions 20 are formed in magnetic material 4. First magnetic portions 18 and second magnetic portions 20 are formed periodically in the circumferential direction of magnetic material 4, over the entire circumference of magnetic material 4. Specifically, first magnetic portions 18 and second magnetic portions 20 are disposed alternately in the circumferential direction of magnetic material 4, over the entire circumference of magnetic material 4. The intervals of first magnetic portions 18 and the intervals of second magnetic portions 20 are uniform.

The plurality of first magnetic portions 18 projects outward in the radial direction of magnetic material 4 further than the plurality of second magnetic portions 20. As such, as indicated by the hatching in FIG. 4, in a cross-section perpendicular to the circumferential direction (θ direction) of magnetic material 4, first cross-sectional area S1 of first magnetic portions 18 is larger than second cross-sectional area S2 of second magnetic portions 20. Accordingly, concave portions and convex portions are formed alternately over the entire outer circumferential portion of magnetic material 4. It should be noted that, in FIG. 4, the border line between adjacent first magnetic portions 18 and second magnetic portions 20 are represented by chain lines.

As illustrated in FIG. 1 to FIG. 3B, each of first magnet 6 and second magnet 8 is a permanent magnet for generating a magnetic field. First magnet 6 and second magnet 8 are formed in the shape of circular columns of the same size, for example. First magnet 6 and second magnet 8 are disposed opposite to an end face (i.e., a flat face orthogonal to the Z-axis) of magnetic material 4, and are disposed spaced apart along the circumferential direction of magnetic material 4. At this time, as illustrated in FIG. 2, first magnet 6 and second magnet 8 are disposed in such a positional relationship that respective pole faces 6a and 8a, which have the same polarity (for example, N-pole), are positioned opposite to the end face of magnetic material 4. It should be noted that, in a plan view in the positive Z-axis direction illustrated in FIG. 3B, first magnet 6 and second magnet 8 may be disposed at positions offset more to the outer circumferential portion side (the concave and convex side) than the center portion of the width in the radial direction of magnetic material 4. It should be noted that each of first magnet 6 and second magnet 8 is fixed to yoke 14. At this time, each of first magnet 6 and second magnet 8 need not necessarily be fixed to yoke 14.

As illustrated in FIG. 1 to FIG. 3B, each of first Hall element 10 and second Hall element 12 is an element for detecting a change in magnetic field. First Hall element 10 and second Hall element 12 are disposed opposite to the end face of magnetic material 4, and are disposed spaced apart along the circumferential direction of magnetic material 4. Furthermore, first Hall element 10 and second Hall element 12 are disposed between first magnet 6 and second magnet 8 in the circumferential direction of magnetic material 4. In a plan view in the positive Z-axis direction illustrated in FIG. 3B, first Hall element 10 and second Hall element 12 are disposed at positions offset more to the outer circumferential portion side than the center portion of the width in the radial direction of magnetic material 4, and are disposed to straddle outer circumferential portions 20a (concave portions of the concave and convex shaped outer circumferential portion of magnetic material 4) in the radial direction of second magnetic portions 20. Accordingly, in a plan view in the positive Z-axis direction illustrated in FIG. 3B, the difference between the overlapping area when part of first magnetic portions 18 and first Hall element 10 (second Hall element 12) and the overlapping area when part of second magnetic portions 20 and part of first Hall element 10 (second Hall element 12) becomes big, and thus detection output of each of first Hall element 10 and second Hall element 12 can be enhanced. It should be noted that first Hall element 10 and second Hall element 12 are fixed to a fixing component (not illustrated in the figures).

Figure 6:
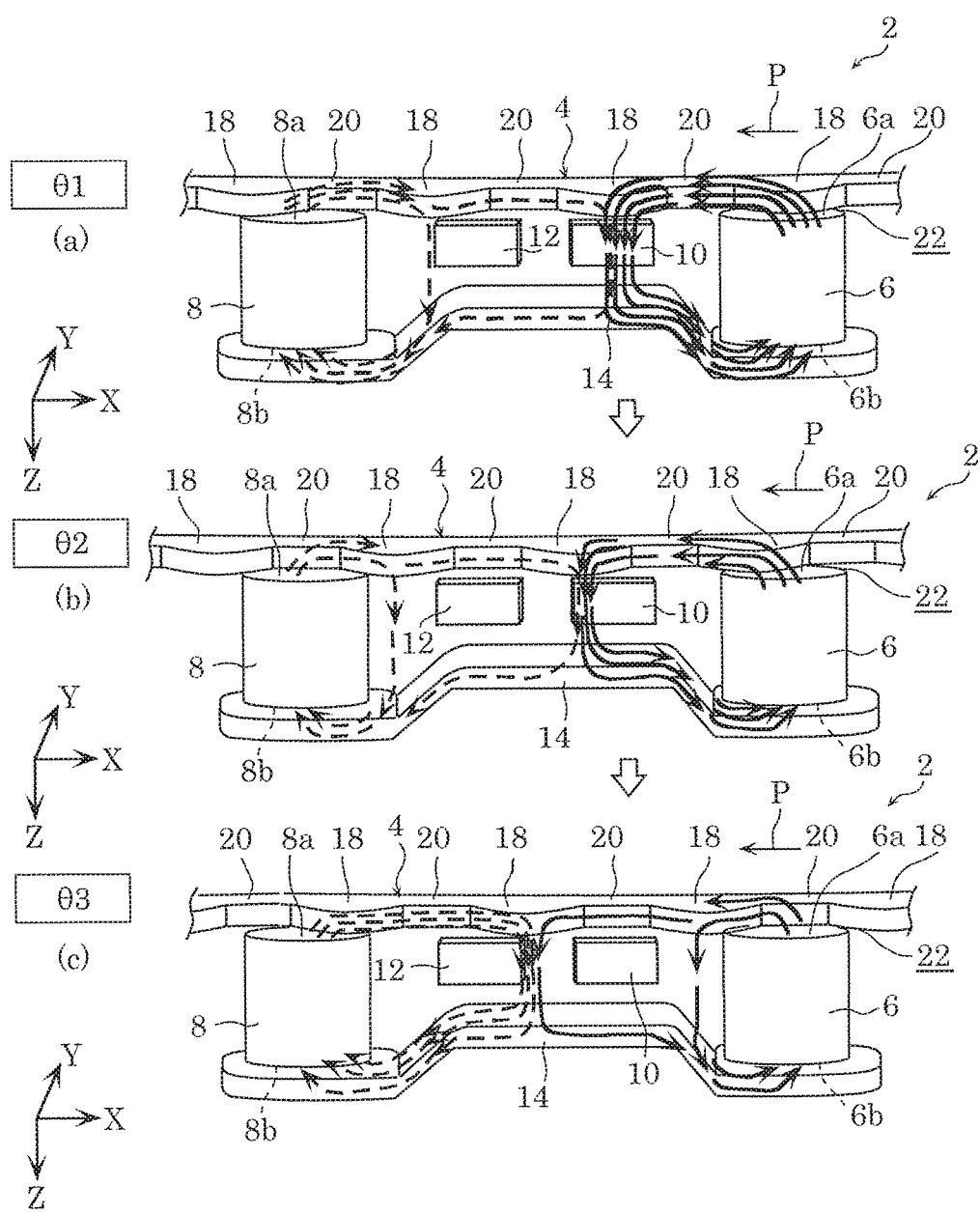
FIG. 6 is a diagram for describing the operation of the rotational manipulation detector according to Embodiment 1.

Accordingly, when seen from the rotation axis (Z-axis) direction of magnetic material 4, first magnet 6, first Hall element 10, second Hall element 12, and second magnet 8 are arranged in stated order along the circumferential direction of magnetic material 4. It should be noted that, as illustrated in FIG. 6 described later, gap 22 is formed between the end face of magnetic material 4 and first magnet 6, second magnet 8, first Hall element 10, and second Hall element 12. The size of gap 22 in the Z-axis direction is for example approximately 1 mm to 2 mm. In order to prevent dust or droplets of water from sticking to first Hall element 10 and second Hall element 12, a rubber sheet component (not illustrated in the figures) may be disposed in gap 22.

As illustrated in FIG. 1 to FIG. 3B, yoke 14 is a component for preventing the broadening of the magnetic field, and stabilizing magnetic flux in the periphery of first Hall element 10 and second Hall element 12. Yoke 14 is disposed opposite to magnetic material 4 in the Z-axis direction, with first magnet 6, second magnet 8, first Hall element 10, and second Hall element 12 interposed therebetween. Specifically, in a plan view in the positive Z-axis direction illustrated in FIG. 3B, first magnet 6, second magnet 8, first Hall element 10, and second Hall element 12 are disposed between magnetic material 4 and yoke 14. Yoke 14 is formed using a soft magnetic material such as iron, for example.

It should be noted that yoke 14 may be omitted depending on, for example, the material and size of magnetic material 4 or the size, etc., of first magnet 6 and second magnet 8.

1-2. Functional Configuration of Rotational Manipulation Detector

Figure 5:
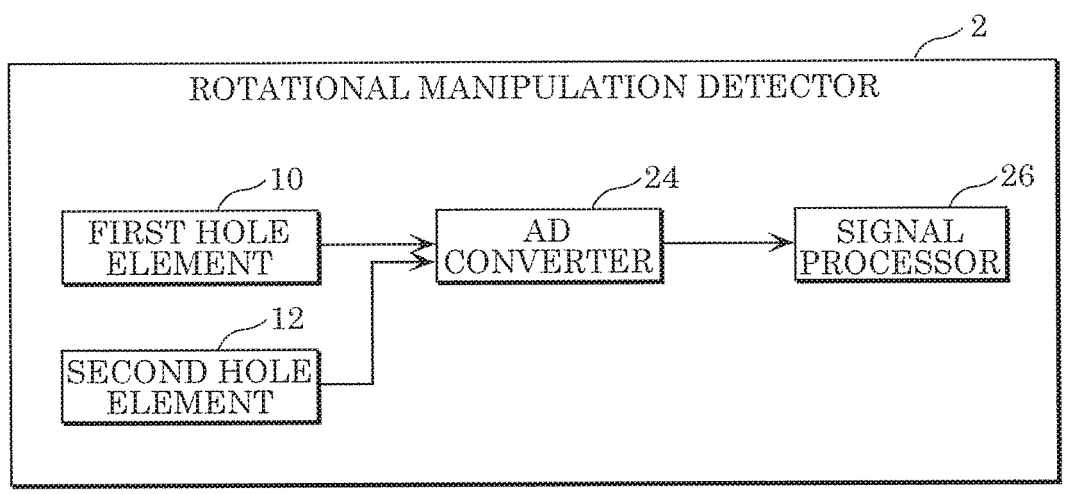
FIG. 5 is a block diagram illustrating the functional configuration of the rotational manipulation detector according to Embodiment 1.

Next, the functional configuration of rotational manipulation detector 2 according to Embodiment 1 will be described with reference to FIG. 5. FIG. 5 is a block diagram illustrating the functional configuration of rotational manipulation detector 2 according to Embodiment 1.

As illustrated in FIG. 5, as a functional configuration, rotational manipulation detector 2 includes first Hall element 10, second Hall element 12, analog-to-digital (AD) converter 24, and signal processor 26.

First Hall element 10 outputs a first voltage signal (an example of a first detection signal) of a magnitude that corresponds to the number of magnetic force lines (magnetic flux density) passing through first Hall element 10, and second Hall element 12 outputs a second voltage signal (an example of a second detection signal) of a magnitude that corresponds to the number of magnetic force lines (magnetic flux density) passing through second Hall element 12.

AD converter 24 converts the first voltage signal and the second voltage signal outputted from first Hall element 10 and second Hall element 12, from analog signals to digital signals.

Signal processor 26 detects the amount of rotation (hereafter also referred to as rotation amount) and direction of rotation (hereafter also referred to as rotation direction) of the manipulation component by processing the first voltage signal and the second voltage signal that have been converted into digital signals by AD converter 24.

1-3. Operation of Rotational Manipulation Detector

Figure 7:
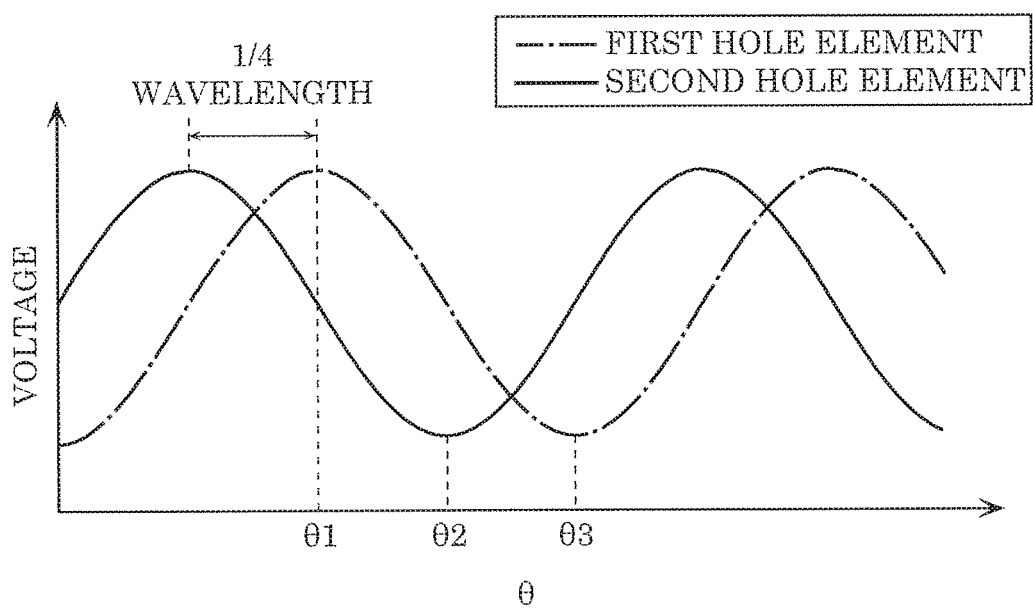
FIG. 7 is a graph for describing the change in voltage signals outputted by a first Hall element and a second Hall element relative to the rotation angle of the magnetic material, according to Embodiment 1.
Figure 8:
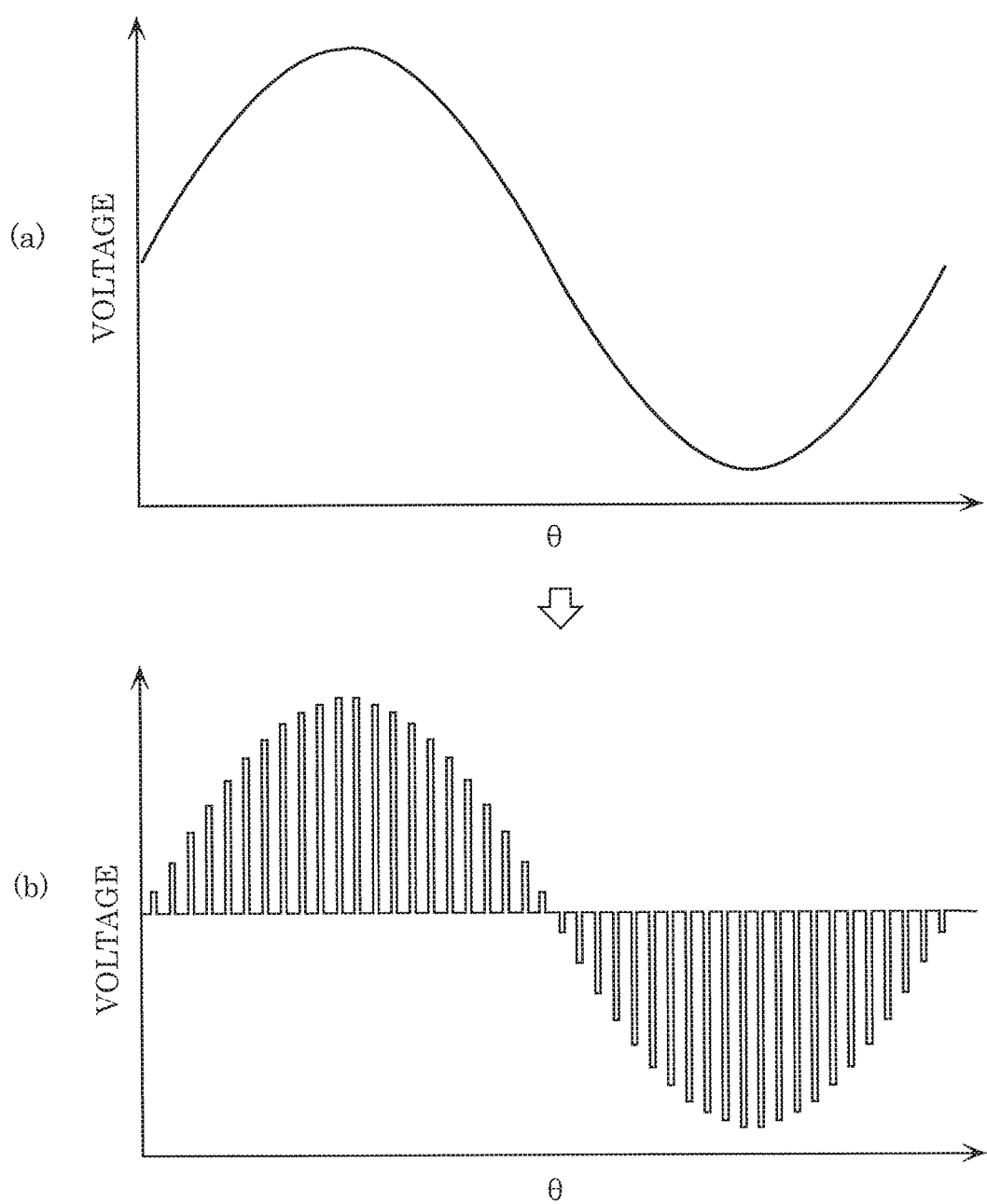
FIG. 8 is a graph for describing the operation of an AD converter according to Embodiment 1.
Figure 9:
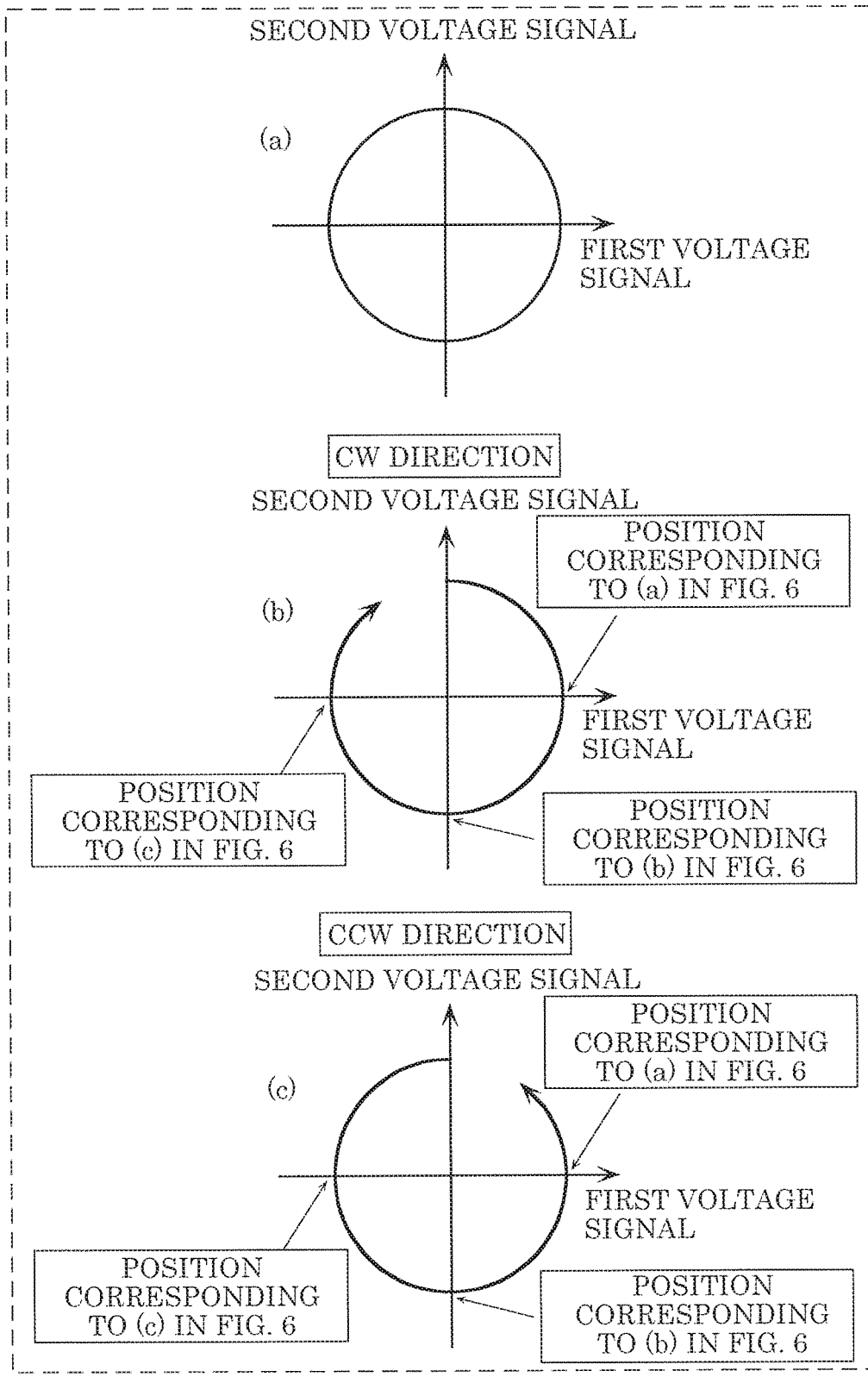
FIG. 9 is a graph for describing the operation of a signal processor according to Embodiment 1.

Next, the operation of rotational manipulation detector 2 according to Embodiment 1 will be described with reference to FIG. 6 to FIG. 9. FIG. 6 is a diagram for describing the operation of rotational manipulation detector 2 according to Embodiment 1. FIG. 7 is a graph for describing the change in the voltage signals outputted by first Hall element 10 and second Hall element 12 relative to rotation angle θ of magnetic material 4, according to Embodiment 1. FIG. 8 is a graph for describing the operation of AD converter 24 according to Embodiment 1. FIG. 9 is a graph for describing the operation of signal processor 26 according to Embodiment 1.

It should be noted that, in FIG. 6, the solid line arrows represent the principal magnetic force lines (magnetic flux) generated from first magnet 6, and the broken line arrows represent the principal magnetic force lines (magnetic flux) generated from second magnet 8. Furthermore, more arrows indicate stronger magnetic force line intensity.

When magnetic material 4 is rotationally manipulated in the direction (i.e., the positive θ direction) indicated by arrow P relative to first magnet 6, first Hall element 10, second Hall element 12, and second magnet 8, the magnetic fields generated by first magnet 6 and second magnet 8 change, from the state illustrated in (a) in FIG. 6 to the state illustrated in (b) in FIG. 6, and then to the state illustrated in (c) in FIG. 6. Following the rotation of magnetic material 4, the positional relationship between (i) first magnetic portions 18 and second magnetic portions 20 and (ii) first magnet 6, first Hall element 10, second Hall element 12, and second magnet 8 changes.

As described above, in a cross-section perpendicular to the circumferential direction (θ direction) of magnetic material 4, first cross-sectional area 51 of first magnetic portions 18 is larger than second cross-sectional area S2 of second magnetic portions 20. As such, more of the magnetic force lines from each of first magnet 6 and second magnet 8 pass through first magnetic portions 18 than second magnetic portions 20.

In the state (rotation angle θ1) illustrated in (a) in FIG. 6, the central axis of first magnet 6 overlaps with first magnetic portion 18, and thus the intensity of the magnetic force lines generated from pole face 6a (for example, N-pole) of first magnet 6 is strongest among the states in (a), (b), and (c) in FIG. 6. As indicated by the solid line arrows, the magnetic force lines generated from pole face 6a of first magnet 6 flow through magnetic material 4, then flow from first magnetic portion 18 into first Hall element 10. The magnetic force lines that have passed through first Hall element 10 flow through yoke 14, and then flow into pole face 6b (for example, S-pole) of first magnet 6.

Furthermore, in the state illustrated in (a) in FIG. 6, the central axis of second magnet 8 is aligned between first magnetic portion 18 and second magnetic portion 20, and thus the intensity of the magnetic force lines generated from pole face 8a (for example, N-pole) of second magnet 8 is approximately intermediate, among the states in (a), (b), and (c) in FIG. 6. Since first magnetic portion 18 has a large cross-sectional area and strong magnetic force compared to second magnetic portion 20, the magnetic force lines generated from pole face 8a of second magnet 8 flow through magnetic material 4, then branch out near first magnetic portion 18, and then part of the magnetic force lines flows from first magnetic portion 18 of magnetic material 4 into first Hall element 10, as indicated by the broken line arrows. The magnetic force lines that have passed through first Hall element 10 flow through yoke 14, and then flow into pole face 8b (for example, S-pole) of second magnet 8. It should be noted that the magnetic force lines generated from pole face 8a of second magnet 8, flow through magnetic material 4, then branch out near first magnetic portion 18, and then part of the magnetic force lines flows from first magnetic portion 18 of magnetic material 4, then through the space between second Hall element 12 and second magnet 8, and then flows into yoke 14. The magnetic flow lines that flowed through yoke 14 converge with the magnetic force lines that have passed through first Hall element 10, and then flow into pole face 8b of second magnet 8.

When magnetic material 4 is rotationally manipulated (rotated) in the direction indicated by arrow P, the magnetic fields generated by first magnet 6 and second magnet 8 change from the state illustrated in (a) in FIG. 6 to the state (rotation angle θ2) illustrated in (b) in FIG. 6. In the state indicated in (b) in FIG. 6, the central axis of first magnet 6 is aligned between first magnetic portion 18 and second magnetic portion 20, and thus the intensity of the magnetic force lines generated from pole face 6a of first magnet 6 is approximately intermediate, among the states in (a), (b), and (c) in FIG. 6 Since first magnetic portion 18 has a large cross-sectional area and strong magnetic force compared to second magnetic portion 20, most of the magnetic force lines generated from pole face 6a of first magnet 6 flows through magnetic material 4, then flows from first magnetic portion 18 of magnetic material 4, then through the space between first Hall element 10 and second Hall element 12, and then flows into yoke 14, as indicated by the solid line arrows. The magnetic flow lines that flowed through yoke 14 flow into pole face 6b of first magnet 6.

Furthermore, in the state illustrated in (b) in FIG. 6, the central axis of second magnet 8 overlaps with second magnetic portion 20, and thus the intensity of the magnetic force lines generated from pole face 8a of second magnet 8 is strongest among the states in (a), (b), and (c) in FIG. 6. Since first magnetic portion 18 has a large cross-sectional area and strong magnetic force compared to second magnetic portion 20, the magnetic force lines generated from pole face 8a of second magnet 8 flow through magnetic material 4, then branch out near first magnetic portion 18, and then part of the magnetic force lines flows from first magnetic portion 18 of magnetic material 4, then through the space between first Hall element 10 and second Hall element 12, and then flows into yoke 14, as indicated by the broken line arrows. The magnetic flow lines that flowed through yoke 14 flow into pole face 8b of second magnet 8. It should be noted that the magnetic force lines generated from pole face 8a of second magnet 8, flow through magnetic material 4, then branch out near first magnetic portion 18, and then part of the magnetic force lines flows from first magnetic portion 18 of magnetic material 4, then through the space between second Hall element 12 and second magnet 8, and then flows into yoke 14. The magnetic flow lines that flowed through yoke 14 converge with the magnetic force lines that have passed through the space between first Hall element 10 and second Hall element 12, and then flow into pole face 8b of second magnet 8.

When magnetic material 4 is rotationally manipulated further in the direction indicated by arrow P, the magnetic fields generated by first magnet 6 and second magnet 8 change from the state illustrated in (b) in FIG. 6 to the state (rotation angle θ3) illustrated in (c) in FIG. 6. In the state illustrated in (c) in FIG. 6, the central axis of first magnet 6 overlaps with second magnetic portion 20, and thus the intensity of the magnetic force lines generated from pole face 6a of first magnet 6 is weakest among the states in (a), (b), and (c) in FIG. 6. Since first magnetic portion 18 has a large cross-sectional area and strong magnetic force compared to second magnetic portion 20, the magnetic force lines generated from pole face 6a of first magnet 6 flow through magnetic material 4, then branch out near first magnetic portion 18, and then part of the magnetic force lines flows from first magnetic portion 18 of magnetic material 4, and then flows into second Hall element 12, as indicated by the solid line arrows. The magnetic force lines that have passed through second Hall element 12 flow through yoke 14, and then flow into pole face 6b of first magnet 6. It should be noted that the magnetic force lines generated from pole face 6a of first magnet 6, flow through magnetic material 4, then branch out near first magnetic portion 18, and then part of the magnetic force lines flows from first magnetic portion 18 of magnetic material 4, then through the space between first magnet 6 and first Hall element 10, and then flows into yoke 14. The magnetic flow lines that flowed through yoke 14 converge with the magnetic force lines that have passed through second Hall element 12, and then flow into pole face 6b of first magnet 6.

Furthermore, in the state illustrated in (c) in FIG. 6, the central axis of second magnet 8 is aligned between first magnetic portion 18 and second magnetic portion 20, and thus the intensity of the magnetic force lines generated from pole face 8a of second magnet 8 is approximately intermediate among the states in (a), (b), and (c) in FIG. 6. Since first magnetic portion 18 has a large cross-sectional area and strong magnetic force compared to second magnetic portion 20, the magnetic force lines generated from pole face 8a of second magnet 8 flows through magnetic material 4, then flows from first magnetic portion 18 of magnetic material 4, then through the space between first Hall element 10 and second Hall element 12, and then flows into yoke 14, as indicated by the broken line arrows. The magnetic flow lines that flowed through yoke 14 flow into pole face 8b of second magnet 8.

As described above, rotation of magnetic material 4 in the direction indicated by arrow P causes the magnetic fields generated by first magnet 6 and second magnet 8 to change. In the state illustrated in (a) in FIG. 6, the number of magnetic force lines that pass through first Hall element 10 become significantly greater than the number of magnetic force lines passing through second Hall element 12. In the state illustrated in (b) in FIG. 6, the number of magnetic force lines that pass through first Hall element 10 become significantly greater than the number of magnetic force lines passing through second Hall element 12. Furthermore, in the state illustrated in (c) in FIG. 6, the number of magnetic force lines passing through first Hall element 10 become less than the number of magnetic force lines passing through second Hall element 12.

As illustrated in FIG. 7, a change in the number of magnetic force lines passing through each of first Hall element 10 and second Hall element 12 causes the first voltage signal and the second voltage signal outputted from first Hall element 10 and second Hall element 12 to change. In FIG. 7, the chain line graph is the waveform representing the change of the first voltage signal outputted from first Hall element 10 relative to rotation angle θ of magnetic material 4, and the solid line graph is the waveform representing the change of the second voltage signal outputted from second Hall element 12 relative to rotation angle θ of magnetic material 4. First Hall element 10 and second Hall element 12 are disposed spaced apart along the circumferential direction of magnetic material 4 so that the phase is shifted by, for example, ¼ wavelength between the waveform representing the change of the first voltage signal relative to rotation angle θ and the waveform representing the change of the second voltage signal relative to rotation angle θ.

As illustrated in (a) in FIG. 8, AD converter 24 obtains the first voltage signal which is an analog signal outputted from first Hall element 10. Subsequently, as illustrated in (b) in FIG. 8, AD converter 24 converts the obtained first voltage signal, from an analog signal to a digital signal at a predetermined sampling rate. It should be noted that, even if magnetic material 4 is rotating, if the peak of a signal is detected at a certain sampling timing and a peak of a signal is also detected in the next sampling timing, it may be determined that magnetic material 4 is stationary. As such, a sufficiently high sampling rate is set so that, even if magnetic material 4 is rotationally manipulated rapidly, the peaks or valleys of the signal outputted from first Hall element 10 are properly read.

In the same manner, AD converter 24 obtains the second voltage signal which is an analog signal outputted from second Hall element 12. Subsequently, AD converter 24 converts the obtained second voltage signal, from an analog signal to a digital signal at a predetermined sampling rate.

Signal processor 26 can detect the rotation amount (or rotation angle) of the manipulation component by counting the pulse number of the first voltage signal (or the pulse number of the second voltage signal) that have been converted into digital signals by AD converter 24. At this time, signal processor 26 can arbitrarily set the aforementioned predetermined sampling rate according to, for example, the use application of rotational manipulation detector 2. For example, by increasing the aforementioned predetermined sampling rate, the rotation amount detection resolution can be easily enhanced.

Furthermore, signal processor 26 detects the rotation direction of the manipulation component based on the first voltage signal and the second voltage signal that have been converted into digital signals by AD converter 24. Specifically, signal processor 26 detects the rotation direction of the manipulation component based on the increase/decrease in the value of the first voltage signal and the second voltage signals.

Here, the principle behind the rotation direction detection by signal processor 26 is described. Hereinafter, for convenience of description, description is carried out using FIG. 9 for describing the increase/decrease in the value of each of the first voltage signal and the second voltage signal. By representing the first voltage signal by the horizontal axis, representing the second voltage signal by the vertical axis, and plotting the voltage values of the first voltage signal and second voltage signal that have been converted into digital signals, a circular graph such as that illustrated in (a) in FIG. 9 can be obtained. The circular graph rotates in the clockwise (CW) direction illustrated in (b) in FIG. 9 or the counter clockwise (CCW) direction illustrated in (c) in FIG. 9, according to the rotation direction (i.e., the direction indicated by arrow P or arrow Q in FIG. 1) of the manipulation component.

For example, as illustrated in (b) in FIG. 9, when the values of both the first voltage signal and the second voltage signal decrease from the position corresponding to (a) in FIG. 6, signal processor 26 detects that the rotation direction of the manipulation component is the direction indicated by arrow P in FIG. 1. Furthermore, as illustrated in (b) in FIG. 9, when the value of the first voltage signal decreases and the value of the second voltage signal increases from the position corresponding to (b) in FIG. 6, signal processor 26 detects that the rotation direction of the manipulation component is the direction indicated by arrow P in FIG. 1.

Furthermore, as illustrated in (c) in FIG. 9, when the value of the first voltage signal increases and the value of the second voltage signal decreases from the position corresponding to (c) in FIG. 6, signal processor 26 detects that the rotation direction of the manipulation component is the direction indicated by arrow Q in FIG. 1. Furthermore, as illustrated in (c) in FIG. 9, when the values of both the first voltage signal and the second voltage signal increase from the position corresponding to (b) in FIG. 6, signal processor 26 detects that the rotation direction of the manipulation component is the direction indicated by arrow Q in FIG. 1.

1-4. Application Example of Rotational Manipulation Detector

1-4-1. Application Example 1

Next, Application Example 1 of rotational manipulation detector 2 according to Embodiment 1 will be described with reference to FIG. 10A and FIG. 10B. Each of FIG. 10A and FIG. 10B is a perspective view for Example application 1 of rotational manipulation detector 2 according to Embodiment 1.

Figure 10A:
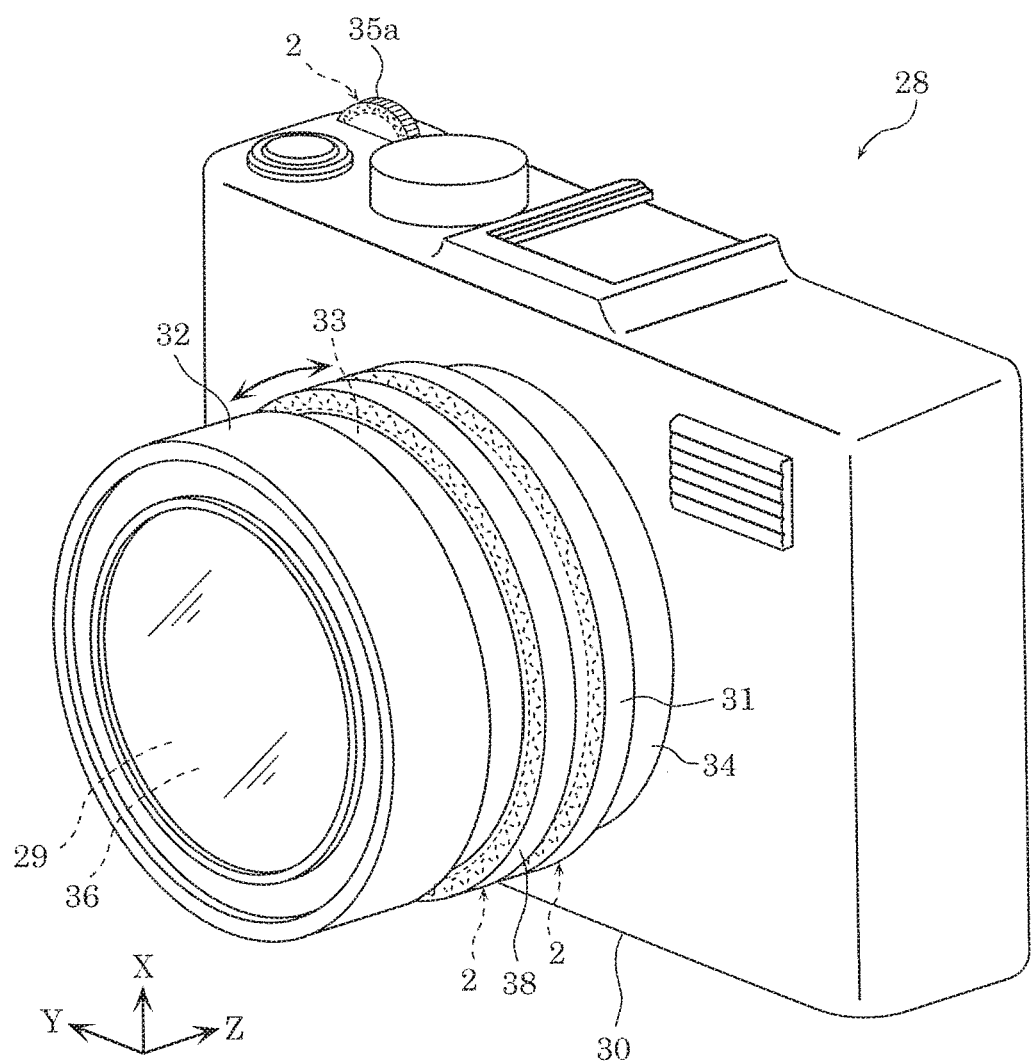
FIG. 10A is a perspective view of Application Example 1 of the rotational manipulation detector according to Embodiment 1.
Figure 10B:
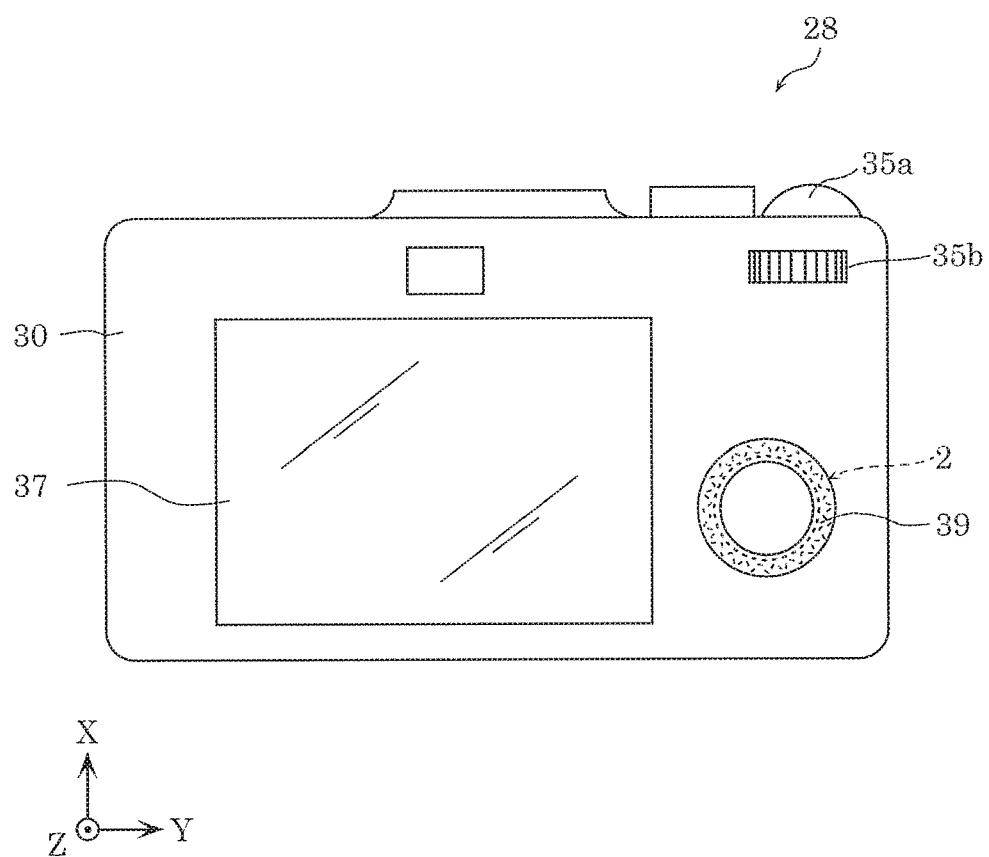
FIG. 10B is a perspective view of Application Example 1 of the rotational manipulation detector according to Embodiment 1.

In the example illustrated in FIG. 10A and FIG. 10B, rotational manipulation detector 2 is provided in imaging device 28 such as a digital still camera, etc. Imaging device 28 includes device body 30 and lens barrel 32.

As illustrated in FIG. 10A, lens barrel 32 includes main body 34, at least one focus lens 36 (an example of a lens), at least one zoom lens 29 (an example of a lens), focus ring 38 (manipulation component), zoom ring 31 (manipulation component), and actuator 33.

Main body 34 is formed in the shape of a circular column and is detachably attached to the front face of device body 30. Focus lens 36 and zoom lens 29 are disposed along the optical axis direction inside main body 34. Each of focus ring 38 and zoom ring 31 are formed in the shape of a ring, and are rotatably disposed in the outer circumferential portion of main body 34. Rotational manipulation detector 2 is disposed inside each of focus ring 38 and zoom ring 31. Actuator 33 is disposed inside main body 34, and causes each of focus lens 36 and zoom lens 29 to move along the optical axis.

When a user manually rotates focus ring 38 relative to main body 34, the rotation direction and the rotation position (rotation amount) of focus ring 38 are detected by rotational manipulation detector 2. Actuator 33 causes focus lens 36 to move along the optical axis according to the detected rotation direction and rotation position of focus ring 38. This adjusts the focus position.

On the other hand, when the user manually rotates zoom ring 31 relative to main body 34, the rotation direction and rotation position of zoom ring 31 are detected by rotational manipulation detector 2. Actuator 33 causes zoom lens 29 to move along the optical axis according to the detected rotation direction and rotation position of zoom ring 31. This adjusts the zoom.

Furthermore, as illustrated in FIG. 10A, front dial 35*a* is disposed in the top face of device body 30. Front dial 35*a* is formed in the shape of a disc, and rotates about the Z-axis. Rotational manipulation detector 2 is disposed inside front dial 35*a*. When the user manually rotates front dial 35*a* relative to device body 30, the rotation direction and the rotation position of front dial 35*a* are detected by rotational manipulation detector 2. This enables various settings of imaging device 28 to be performed.

In addition, as illustrated in FIG. 10B, display 37, control button 39, and back dial 35*b* are disposed in the back face of device body 30. Captured images, for example, are displayed on display 37.

Control button 39 is formed in the shape of a ring and rotates about the Z-axis. Rotational manipulation detector 2 is disposed inside control button 39. When the user manually rotates control button 39 relative to device body 30, the rotation direction and the rotation position of control button 30 are detected by rotational manipulation detector 2. This enables various settings of imaging device 28 to be performed.

Back dial 35*b* is formed in the shape of a disc, and rotates about the X-axis. Although not illustrated in the figures, rotational manipulation detector 2 is also disposed inside back dial 35*b*, in the same manner as in front dial 35*a*.

1-4-2. Application Example 2

Figure 11:
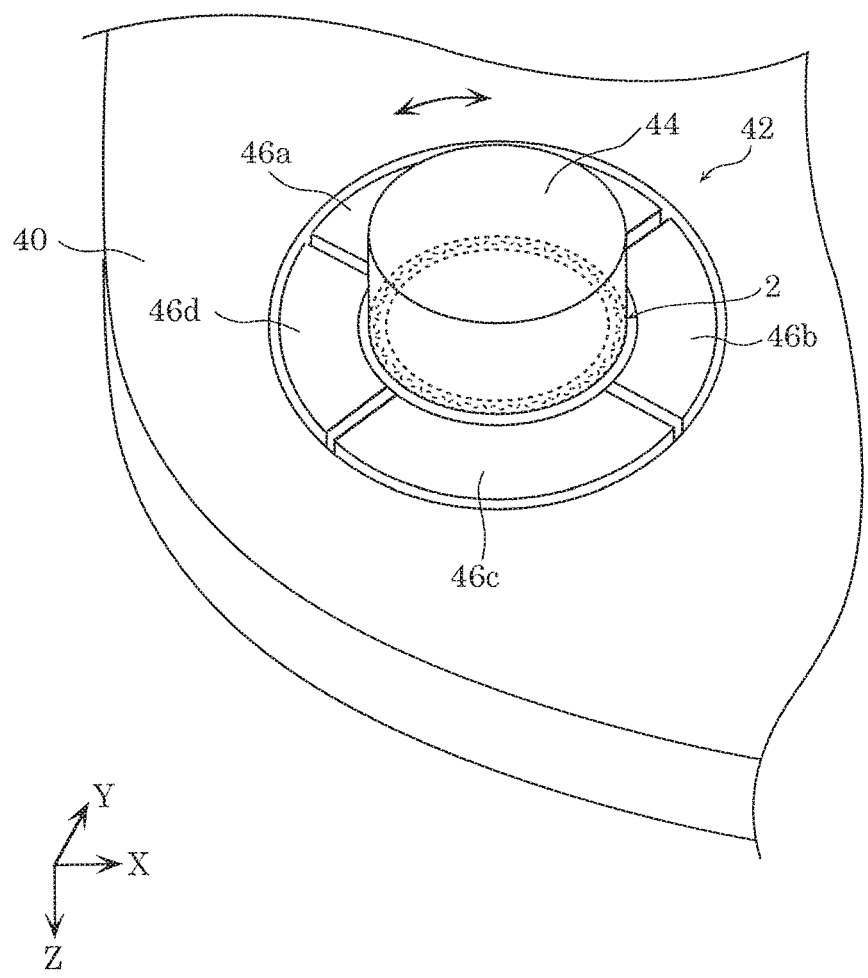
FIG. 11 is a perspective view of Application Example 2 of the rotational manipulation detector according to Embodiment 1.

Next, Application Example 2 of rotational manipulation detector 2 according to Embodiment 1 will be described with reference to FIG. 11. FIG. 11 is a perspective view for Example application 2 of rotational manipulation detector 2 according to Embodiment 1.

In the example illustrated in FIG. 11, rotational manipulation detector 2 is provided in control panel 42 disposed in dashboard 40 of a vehicle. Control panel 42 is a user interface for operating an in-vehicle device such as a car air conditioner or a car navigation system. Control panel 42 includes dial switch 44 (manipulation component), push switches 46*a*, 46*b*, 46*c*, and 46*d* (46*a* to 46*d*).

Dial switch 44 is formed in the shape of a hollow circular column, and is rotatably supported by dashboard 40. Rotational manipulation detector 2 is attached to the bottom end portion of dial switch 44. Each of push switches 46*a* to 46*d* is formed in the shape of an arc, and is pushably supported by dashboard 40.

When the user manually rotates dial switch 44, for example, the temperature setting, etc., of the car air conditioner is adjusted. At this time, the rotation amount and the rotation direction of dial switch 44 are detected by rotational manipulation detector 2.

1-5. Advantageous Effects, Etc.

In this embodiment, rotational manipulation detector 2 includes: magnetic material 4 in the shape of a ring and including, disposed alternately in the circumferential direction of magnetic material 4, first magnetic portions 18 each having first cross-sectional area S1 in the circumferential direction and second magnetic portions 20 each having, in the circumferential direction, second cross-sectional area S2 different from first cross-sectional area 51; first magnet 6 disposed opposite to magnetic material 4; and first Hall element 10 and second Hall element 12 which are disposed opposite to magnetic material 4 and detect a change in a magnetic field which occurs when magnetic material 4 is rotated. First magnet 6, first Hall element 10, and second Hall element 12 are disposed side by side along the circumferential direction of magnetic material 4.

Accordingly, the rotational manipulation of the manipulation component is detected using first Hall element 10 and second Hall element 12. At this time, for example, in the case where each of the first voltage signal and the second voltage signal outputted from first Hall element 10 and second Hall element 12 is converted from an analog signal to a digital signal at a predetermined sampling rate, the rotation amount detection resolution can be easily enhanced by adjusting the predetermined sampling rate. In addition, in a non-contact type rotational manipulation detector 2 using first Hall element 10 and second Hall element 12, friction between parts of a detection unit does not occur when the manipulation component is rotated, and thus deterioration of detection signals generated by the detection unit can be reduced, and product life can be extended.

Furthermore, in this embodiment, rotational manipulation detector 2 further includes second magnet 8 disposed opposite to magnetic material 4. First magnet 6, second magnet 8, first Hall element 10, and second Hall element 12 are disposed side by side along the circumferential direction of magnetic material 4.

Accordingly, since two magnets, first magnet 6 and second magnet 8, are used, magnetic fields can be effectively generated.

Furthermore, in this embodiment, first Hall element 10 and second Hall element 12 are disposed between first magnet 6 and second magnet 8 in the circumferential direction of magnetic material 4.

Accordingly, the magnetic fields between first magnet 6 and second magnet 8 can be stabilized, and thus the rotational manipulation of the manipulation component can be precisely detected.

Furthermore, in this embodiment, first magnetic portions 18 project further in the radial direction of magnetic material 4 than second magnetic portions 20. In a cross-section perpendicular to the circumferential direction of magnetic material 4, first cross-sectional area 51 is larger than second cross-sectional area S2.

Accordingly, the thickness (i.e., the size in the Z-axis direction) of magnetic material 4 can be kept minimal, and thus rotational manipulation detector 2 can be made thin.

Furthermore, in this embodiment, rotational manipulation detector 2 further includes yoke 14 disposed opposite to magnetic material 4, with first magnet 6, first Hall element 10, and second Hall element 12 interposed between yoke 14 and magnetic material 4.

Accordingly, magnetic force lines that have passed through each of first Hall element 10 and second Hall element 12 can be prevented from leaking away from magnetic material 4. As a result, first Hall element 10 and second Hall element 12 enable a change in the magnetic fields to be detected effectively.

Furthermore, in this embodiment, rotational manipulation detector 2 further includes signal processor 26 that detects the rotation direction and the rotation position of magnetic material 4, based on a first detection signal from first Hall element 10 and a second detection signal from second Hall element 12.

Accordingly, the rotation direction and rotation position of the manipulation component can be detected.

Furthermore, in this embodiment, lens barrel 32 includes: rotational manipulation detector 2 according to any of the aspects described above; at least one focus lens 36 that moves along the optical axis of lens barrel 32; and actuator 33 that causes the at least one focus lens 36 to move according to the rotation direction and the rotation position detected by rotational manipulation detector 2.

Accordingly, lens barrel 32 can be made smaller in size.

Embodiment 2

2-1. Overall Configuration of Rotational Manipulation Detector

Figure 12A:
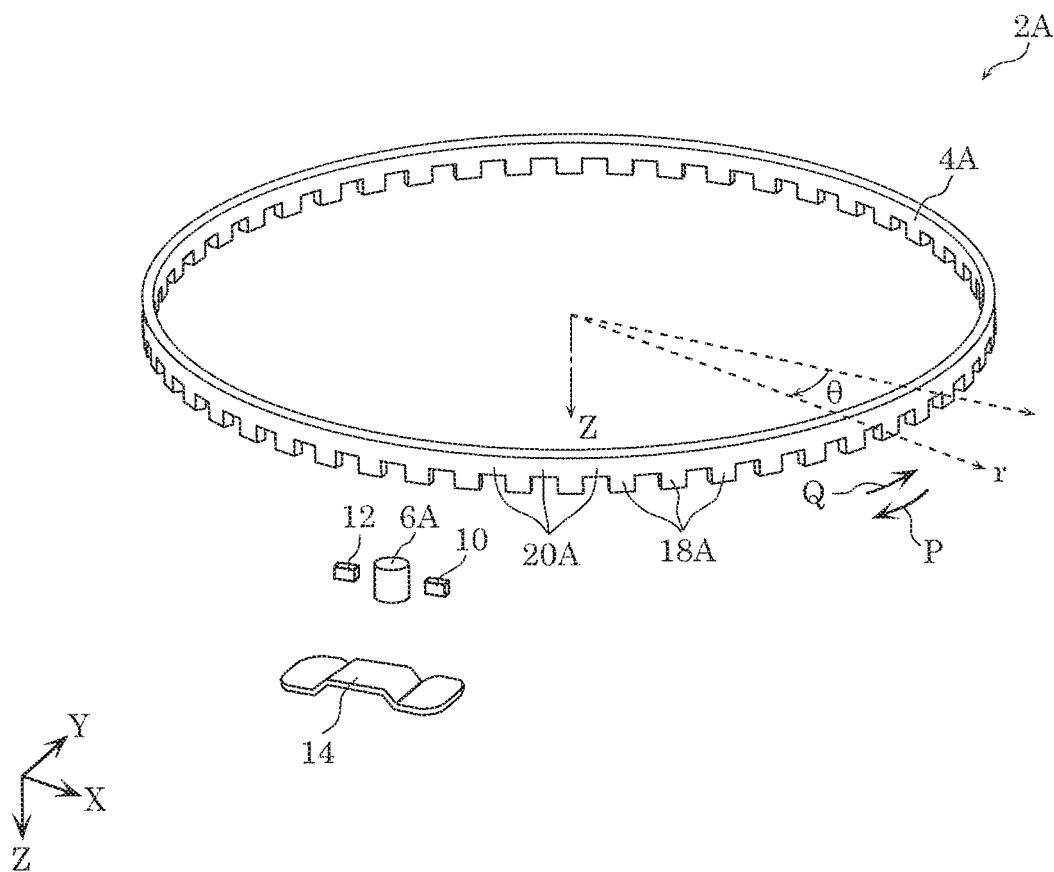
FIG. 12A is an exploded perspective view of a rotational manipulation detector according to Embodiment 2.
Figure 12B:
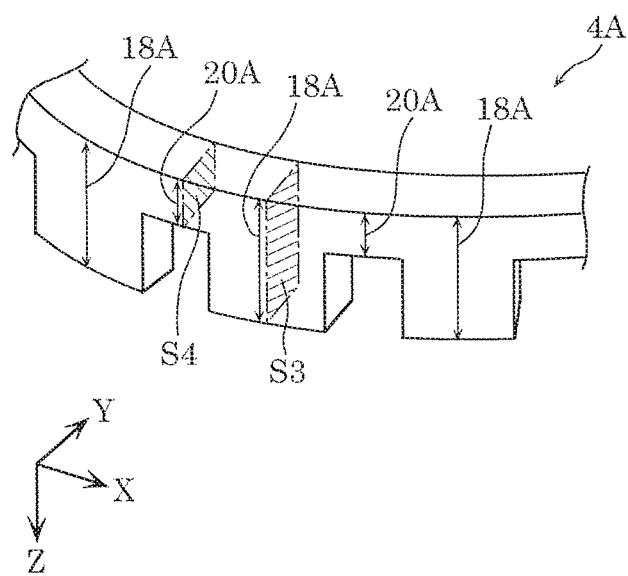
FIG. 12B is a main part perspective view illustrating an enlarged view of part of a magnetic material according to Embodiment 2.
Figure 13:
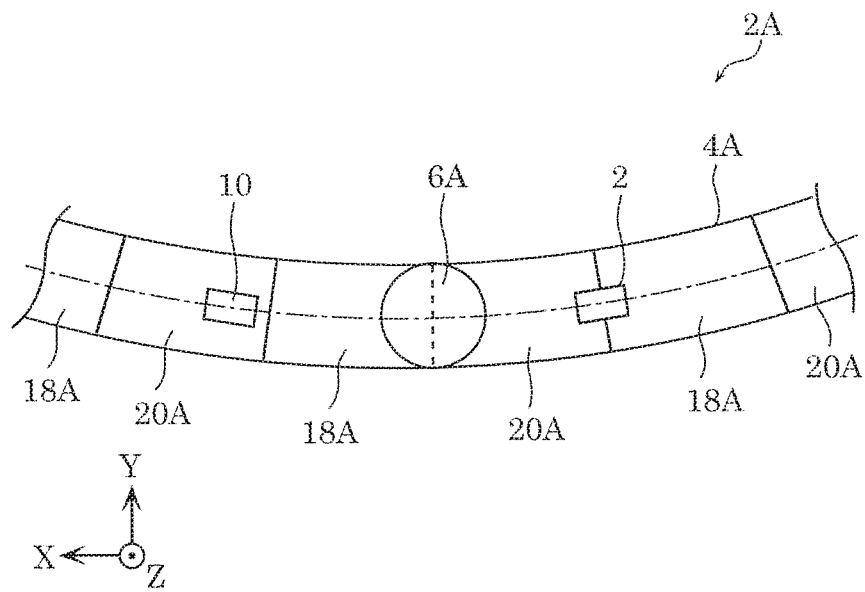
FIG. 13 is a main part plan view illustrating an enlarged view of part of the rotational manipulation detector according to Embodiment 2.

Next, the overall configuration of rotational manipulation detector 2A according to Embodiment 2 will be described with reference to FIG. 12A to FIG. 13. FIG. 12A is an exploded perspective view of rotational manipulation detector 2A according to Embodiment 2. FIG. 12B is a main part perspective view illustrating an enlarged view of part of magnetic material 4A according to Embodiment 2. FIG. 13 is a main part plan view illustrating an enlarged view of part of rotational manipulation detector 2A according to Embodiment 2. It should be noted that, in this embodiment, elements that are the same as those in Embodiment 1 are given the same reference signs, and their description is omitted.

As illustrated in FIG. 12A, in rotational manipulation detector 2A according to Embodiment 2, the shape of magnetic material 4A is different from the shape of magnetic material 4 according to Embodiment 1. Specifically, first magnetic portions 18A project further in the positive Z-axis direction of magnetic material 4 than second magnetic portions 20A. As indicated by the hatching in FIG. 12B, in a cross-section perpendicular to the circumferential direction (θ direction) of magnetic material 4A, first cross-sectional area S3 of first magnetic portions 18A is larger than second cross-sectional area S4 of second magnetic portions 20A. Accordingly, concave portions and convex portions are formed alternately along the entire circumference of the end face in the positive Z-axis direction of magnetic material 4A.

Furthermore, as illustrated in FIG. 12A, in rotational manipulation detector 2A according to Embodiment 2, the placement of first magnet 6A is different from the placement of first magnet 6 according to Embodiment 1. Specifically, first magnet 6A is disposed between first Hall element 10 and second Hall element 12 in the circumferential direction of magnetic material 4A. In a plan view in the negative Z-axis direction illustrated in FIG. 13, the center portions of first Hall element 10 and second Hall element 12 are substantially aligned with the center portion (aligned with the chain line) of the width in the radial direction of magnetic material 4A. Furthermore, the center portion (radial center) of first magnet 6A is substantially aligned with the center portion of the width in the radial direction of magnetic material 4A, and the size of first magnet 6A in the radial direction is substantially the same as the width in the radial direction of magnetic material 4A. It should be noted that second magnet 8 described in Embodiment 1 is not provided.

2-2. Advantageous Effects, Etc.

As described above, in this embodiment, first magnet 6A is disposed between first Hall element 10 and second Hall element 12 in the circumferential direction of magnetic material 4A.

Accordingly, the respective magnetic fields of first Hall element 10 and second Hall element 12 can be stabilized, and the rotational manipulation of the manipulation component can be precisely detected.

Summary of Embodiments 1 and 2

Figure 14:
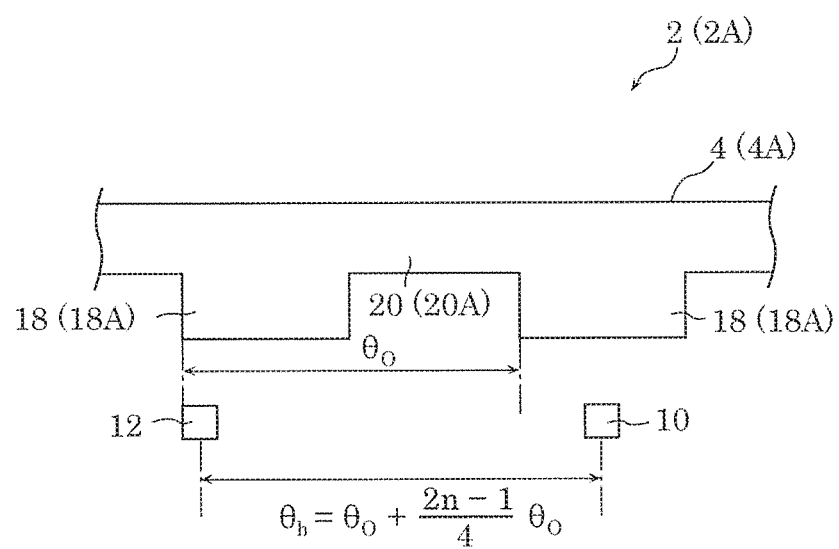
FIG. 14 is a schematic diagram for describing the positional relationship between the magnetic material and the first Hall element and second Hall element, in the rotational manipulation detector according to Embodiments 1 and 2.

Next the positional relationship between magnetic material 4 (4A) and first Hall element 10 and second Hall element 12, in rotational manipulation detector 2 (2A) according to Embodiments 1 and 2 will be described with reference to FIG. 14. FIG. 14 is a schematic diagram for describing the positional relationship between magnetic material 4 (4A) and first Hall element 10 and second Hall element 12, in rotational manipulation detector (2) 2A according to Embodiments 1 and 2.

As illustrated in FIG. 14, when the angle equivalent to the arrangement period of first magnetic portions 18 (18A) of magnetic material 4 (4A) is denoted as $\theta_0$, angle $\theta_h$ equivalent to the arrangement interval between first Hall element 10 and second Hall element 12 is expressed by Equation 1 below. In Equation 1 below, n is an integer greater than or equal to 0 (i.e., n=0, 1, ... ). It should be noted that, in the example illustrated in FIG. 14, n=1.

$$\theta_h = \theta_0 + (2n-1)\theta_0/4 \quad \text{(Equation 1)}$$

By disposing first Hall element 10 and second Hall element 12 with an arrangement interval based on Equation 1, along the circumferential direction of magnetic material 4 (4A), the phase can be shifted by ¼ wavelength between the waveform representing the change of the first voltage signal relative to rotation angle θ and the waveform representing the change of the second voltage signal relative to rotation angle θ, as illustrated in FIG. 7 described above.

Embodiment 3

3-1. Overall Configuration of Rotational Manipulation Detector

Figure 15:
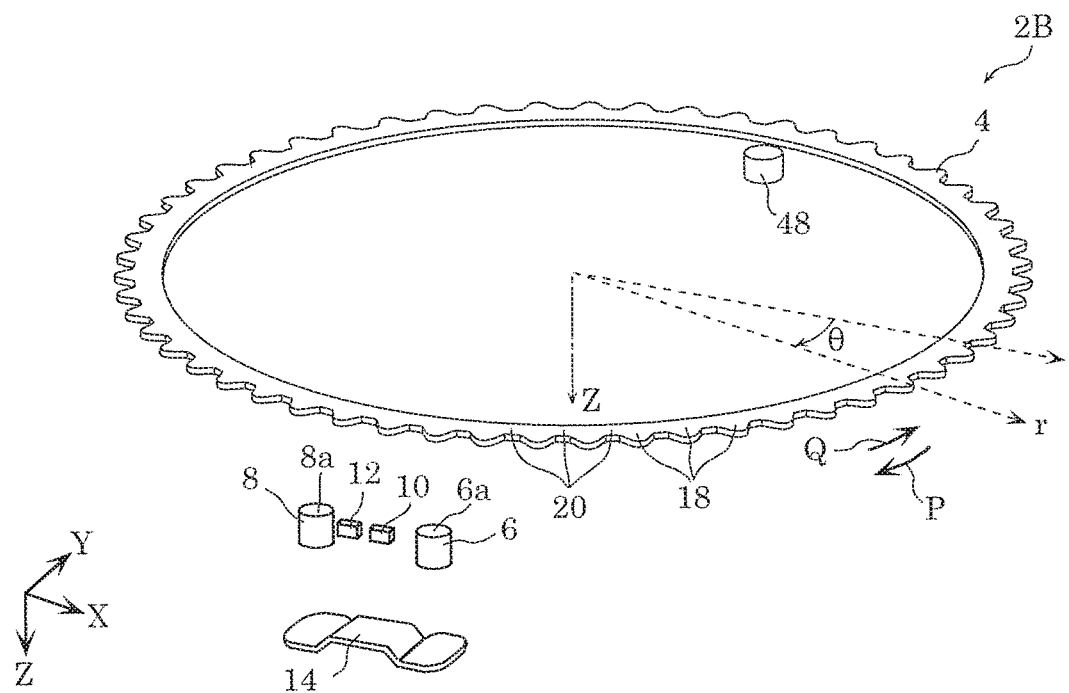
FIG. 15 is an exploded perspective view of a rotational manipulation detector according to Embodiment 3.
Figure 16:
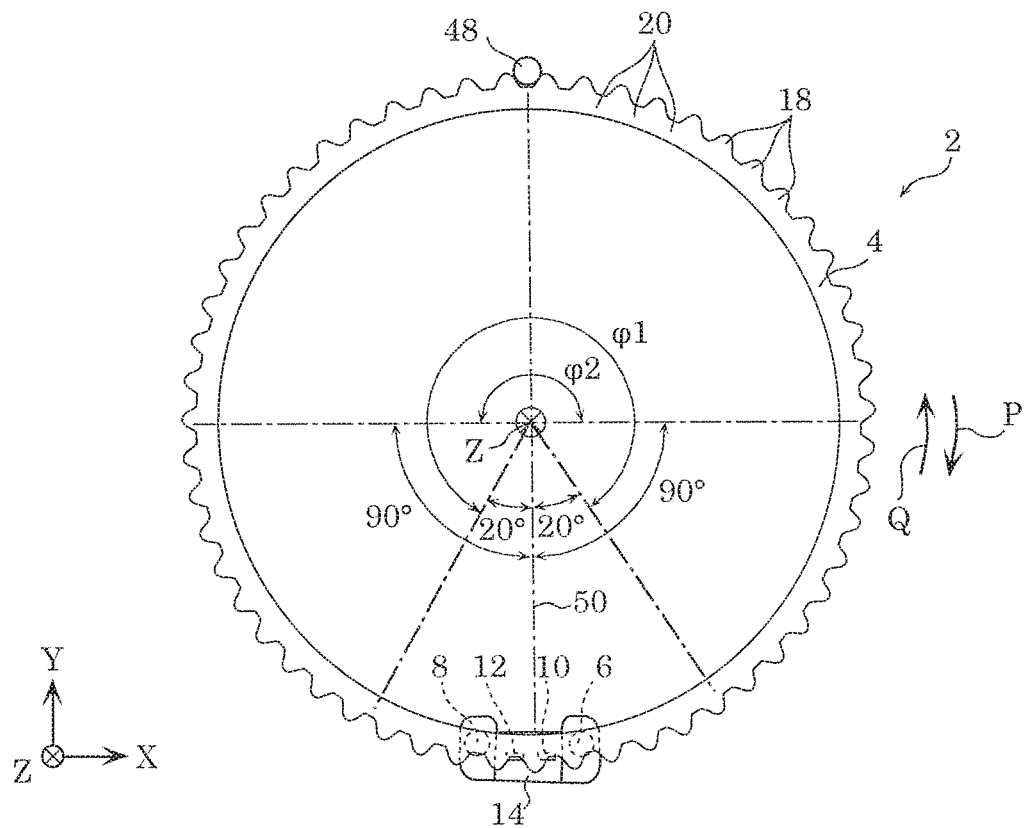
FIG. 16 is a plan view of the rotational manipulation detector according to Embodiment 3.
Figure 17:
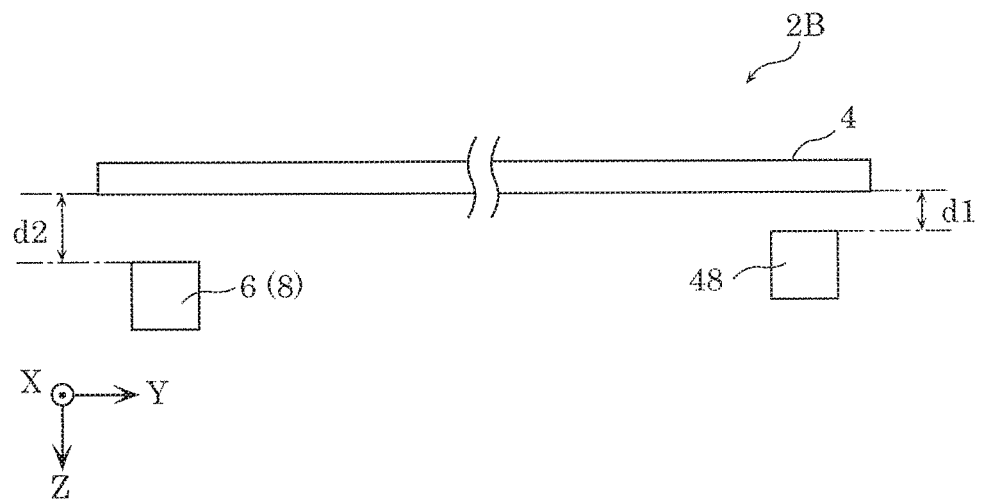
FIG. 17 is a side view schematically illustrating the rotational manipulation detector according to Embodiment 3.
Figure 18:
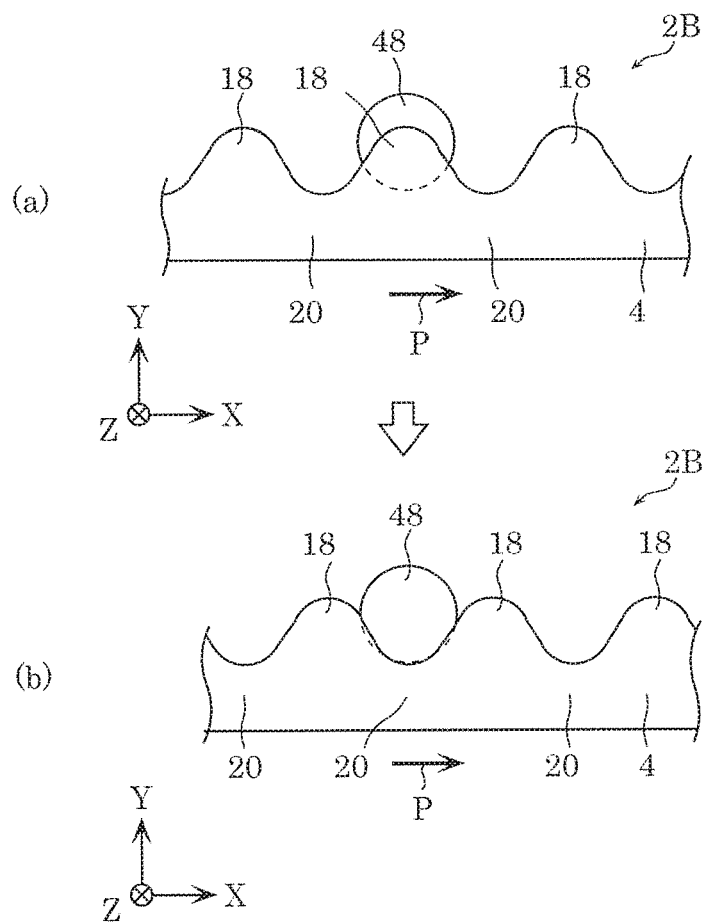
FIG. 18 is a diagram for describing the positional relationship between a magnetic material and a third magnet in the rotational manipulation detector according to Embodiment 3.
Figure 19:
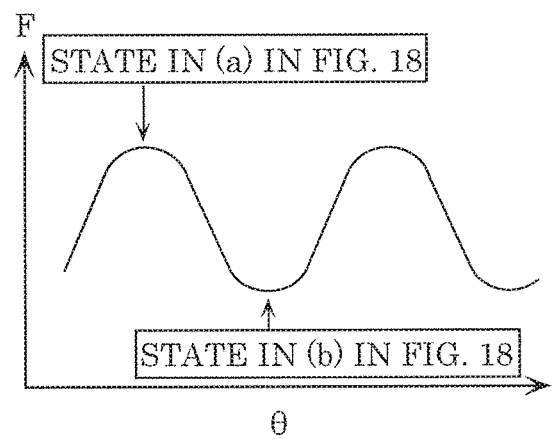
FIG. 19 is a graph for describing the change of an attraction force of the third magnet relative to the rotational angle of the magnetic material, in the rotational manipulation detector according to Embodiment 3.

Next, the overall configuration of rotational manipulation detector 2B according to Embodiment 3 will be described with reference to FIG. 15 to FIG. 19. FIG. 15 is an exploded perspective view of rotational manipulation detector 2B according to Embodiment 3. FIG. 16 is a plan view of rotational manipulation detector 2B according to Embodiment 3. FIG. 17 is a side view schematically illustrating rotational manipulation detector 2B according to Embodiment 3. FIG. 18 is a diagram for describing the positional relationship between magnetic material 4 and third magnet 48 in rotational manipulation detector 2B according to Embodiment 3. FIG. 19 is a graph for describing the change of attraction force F of third magnet 48 relative to rotational angle θ of magnetic material 4, in rotational manipulation detector 2B according to Embodiment 3.

As illustrated in FIG. 15, rotational manipulation detector 2B according to Embodiment 3 includes third magnet 48 in addition to the elements of rotational manipulation detector 2 according to Embodiment 1.

Third magnet 48 is a permanent magnet for providing tactile feedback (a feeling of operation) when magnetic material 4 is rotationally manipulated. As illustrated in FIG. 15, third magnet 48 is formed, for example, in the shape of a circular column.

Third magnet 48 is disposed opposite an end face (i.e., a plane orthogonal to the Z-axis) of magnetic material 4, on the same side of magnetic material 4 as first magnet 6 and second magnet 8. It should be noted that, in a plan view in the positive Z-axis direction illustrated in FIG. 16, third magnet 48 is disposed at a position offset more to the outer circumferential portion side than the center portion of the width in the radial direction of magnetic material 4. It should be noted that third magnet 48 may be disposed on a different side of magnetic material 4 from first magnet 6 and second magnet 8.

Furthermore, in a plan view in the positive Z-axis direction illustrated in FIG. 16, third magnet 48 is disposed at a position substantially symmetric to the midpoint between first Hall element 10 and second Hall element 12 with respect to the rotation axis (Z-axis) of magnetic material 4. Accordingly, it is possible to reduce the effect on first Hall element 10 and second Hall element 12 of attraction force F acting between third magnet 48 and magnetic material 4. It should be noted that, in a plan view in the positive Z-axis direction illustrated in FIG. 16, third magnet 48 is preferably disposed within angle range φ1 outside the ±20 degree angle range centered on line 50 running through the rotation axis of magnetic material 4 and the midpoint between first Hall element 10 and second Hall element 12, out of the entire circumference of magnetic material 4. Furthermore, out of the entire circumference of magnetic material 4, third magnet 48 is more preferably disposed within angle range φ2 outside the ±90 degree angle range centered on line 50.

Furthermore, in the side view illustrated in FIG. 17, distance d1 between third magnet 48 and the end face of magnetic material 4 is shorter than distance d2 between first magnet 6 and second magnet 8 and the end face of magnetic material 4.

Next, the function of third magnet 48 will be described. As illustrated in FIG. 18, when magnetic material 4 is rotationally manipulated in the direction (positive θ direction) indicated by arrow P, the state in which a part of third magnet 48 and a part of first magnetic portion 18 overlap (i.e., the state illustrated in (a) in FIG. 18) and the state in which a part of third magnet 48 and a part of first magnetic portion 18 do not overlap (i.e., the state illustrated in (b) in FIG. 18) are alternately repeated. At this time, as illustrated in FIG. 19, attraction force F acting between third magnet 48 and magnetic material 4 is strongest in the state illustrated in (a) in FIG. 18, and weakest in the state illustrated in (b) in FIG. 18. In this manner, when magnetic material 4 is rotated, the strong and weak states of attraction force F is alternately repeated, thereby providing tactile feedback when magnetic material 4 is rotationally manipulated.

Therefore, in the case where rotational manipulation detector 2B is provided in focus ring 38 of imaging device 28 (see FIG. 10A) for example, when the user manually rotates focus ring 38, feeling the above-described tactile feedback enables the user to obtain an intuitive sense of how much focus ring 38 has rotated. As a result, the user can manipulate focus ring 38 in clear amounts of rotation, and thus adjustment to the position desired by the user is facilitated.

3-2. Advantageous Effects, Etc.

As described above, in this embodiment, rotational manipulation detector 2B further includes third magnet 48 disposed opposite magnetic material 4, for providing tactile feedback when magnetic material 4 is rotationally manipulated.

Accordingly, it is possible to obtain an intuitive feel as to how much magnetic material 4 has been rotated.

3-3. Variation 1

Figure 20:
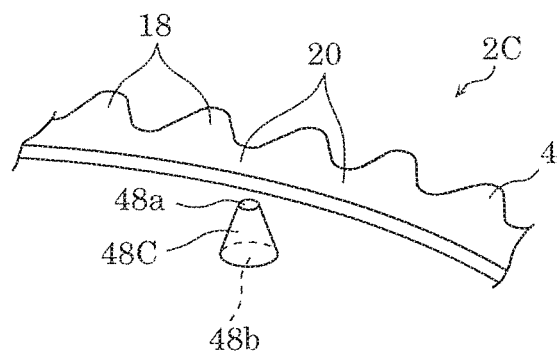
FIG. 20 is a main part perspective view illustrating an enlarged view of part of the rotational manipulation detector according to Modification 1 of Embodiment 3.

Next, rotational manipulation detector 2C according to Variation 1 of Embodiment 3 will be described with reference to FIG. 20. FIG. 20 is a main part perspective view illustrating an enlarged view of part of rotational manipulation detector 2C according to Variation 1 of Embodiment 3.

As illustrated in FIG. 20, in rotational manipulation detector 2C according to Variation 1, the shape of third magnet 48C is different to the shape of third magnet 48 described earlier. Specifically, third magnet 48C is formed in the shape of a truncated cone. Small-diameter-side pole face 48a and large-diameter-side pole face 48b are formed at the ends of third magnet 48C. Small-diameter-side pole face 48a of third magnet 48C is disposed opposite to the end face of magnetic material 4.

Accordingly, since the density of the magnetic force lines passing through small-diameter-side pole face 48a of third magnet 48C increases, the attraction force acting between third magnet 48C and magnetic material 4 can be further enhanced.

3-4. Variation 2

Figure 21:
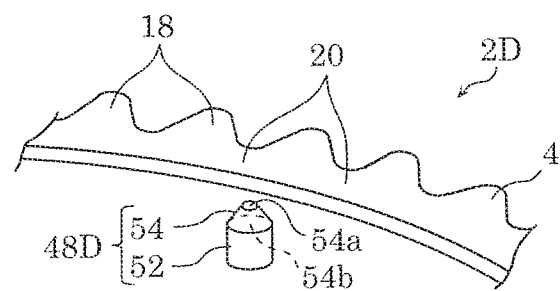
FIG. 21 is a main part perspective view illustrating an enlarged view of part of the rotational manipulation detector according to Modification 2 of Embodiment 3.

Next, rotational manipulation detector 2D according to Variation 2 of Embodiment 3 will be described with reference to FIG. 21. FIG. 21 is a main part perspective view illustrating an enlarged view of part of rotational manipulation detector 2D according to Variation 2 of Embodiment 3.

As illustrated in FIG. 21, in rotational manipulation detector 2D according to Variation 2, the configuration of third magnet 48D is different from the configuration of third magnet 48 described earlier. Specifically, third magnet 48D is formed by combining circular column-shaped magnet 52 and truncated cone-shaped yoke 54. Magnet 52 is formed using a permanent magnet. Yoke 54 is formed using a soft magnetic material such as iron, for example.

Large-diameter-side pole face 54b of yoke 54 is bonded to one pole face of magnet 52. Small-diameter-side pole face 54a of yoke 54 is disposed opposite to the end face of magnetic material 4.

Accordingly, in the same manner as in Variation 1, the attraction force acting between third magnet 48D and magnetic material 4 can be further enhanced.

Embodiment 4

Figure 22:
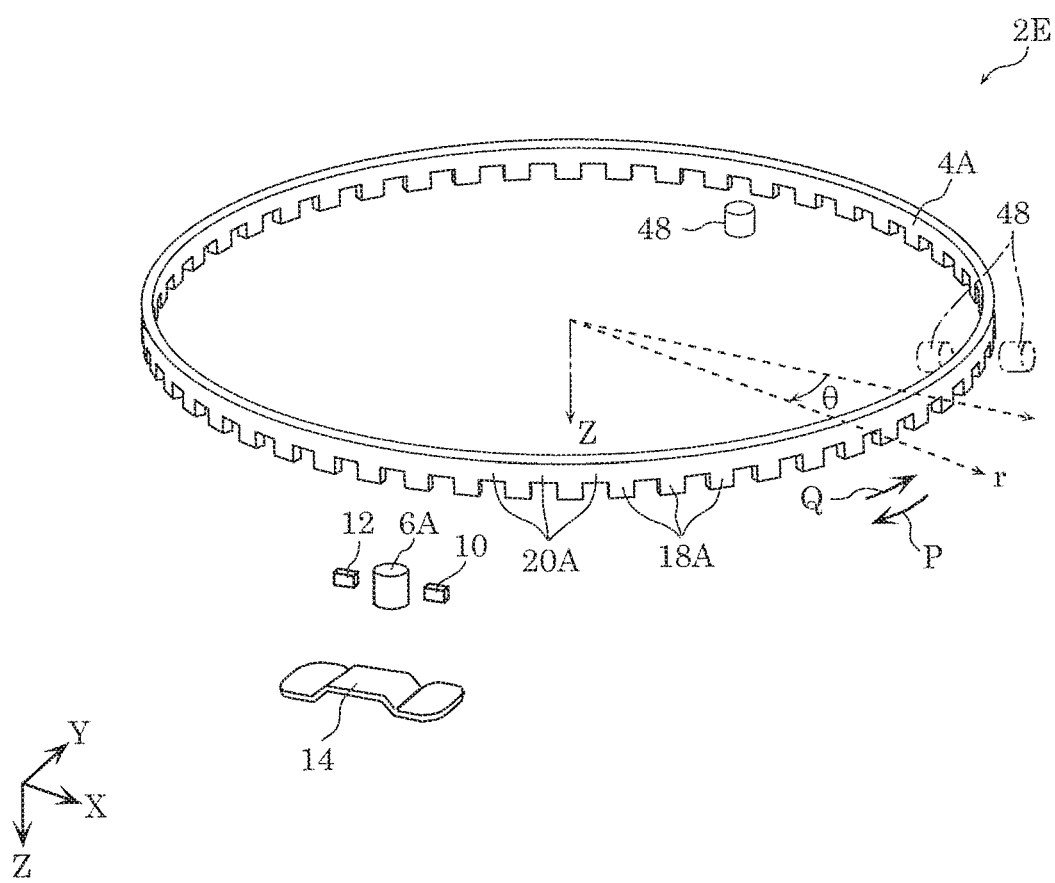
FIG. 22 is an exploded perspective view of a rotational manipulation detector according to Embodiment 4.

Next, the overall configuration of rotational manipulation detector 2E according to Embodiment 4 will be described with reference to FIG. 22. FIG. 22 is an exploded perspective view of rotational manipulation detector 2E according to Embodiment 4.

As illustrated in FIG. 22, rotational manipulation detector 2E according to Embodiment 4 includes third magnet 48 in addition to the elements of rotational manipulation detector 2A according to Embodiment 2. Since the configuration of third magnet 48 is the same as in Embodiment 3, description thereof is omitted.

Third magnet 48 is disposed opposite to the end face in the positive Z-axis direction of magnetic material 4A, on the same side of magnetic material 4A as first magnet 6A. Specifically, in the plan view in the positive Z-axis direction illustrated in FIG. 22, third magnet 48 is disposed to overlap with first magnetic portions 18A or second magnetic portions 20A of magnetic material 4A.

In the same manner as in Embodiment 3, when magnetic material 4A is rotationally manipulated in the direction (positive θ direction) indicated by arrow P, the state in which part of third magnet 48 and part of first magnetic portion 18A overlap and the state in which part of third magnet 48 and part of second magnetic portion 20A overlap are alternately repeated. Therefore, the same advantageous effects as in Embodiment 3 can also be obtained with this Embodiment.

It should be noted that, as indicated by the chain line in FIG. 22, third magnet 48 may be disposed opposite to the lateral face in the outer side in the radial direction (or the lateral face in the inner side in the radial direction) of magnetic material 4A.

OTHER EMBODIMENTS

Hereinbefore, techniques disclosed in the present application have been exemplified by way of Embodiments 1 through 4. However, the techniques disclosed in the present disclosure are not limited to these examples, and can also be applied to embodiments in which modifications, replacements, additions, and omissions have been made. Moreover, various elements described in Embodiments 1 through 4 may be combined to realize a new embodiment.

In view of this, hereinafter, examples of other embodiments will be given.

In Embodiments 1 and 3, first magnetic portions 18 project outward in the radial direction of magnetic material 4 further than second magnetic portions 20 but are not limited to this configuration, and may protrude inward in the radial direction of magnetic material 4.

In each of the foregoing embodiments, first magnetic portions 18 (18A) and second magnetic portions 20 (20A) are formed over the entire circumference of magnetic material 4 (4A) but are not limited to this configuration and may be formed in only part of the circumference of magnetic material 4 (4A).

In Embodiments 2 and 4, first magnet 6A is disposed between first Hall element 10 and second Hall element 12 in the circumferential direction of magnetic material 4A but the configuration is not limited to such, and first Hall element 10 may be disposed between first magnet 6A and second Hall element 12.

In Embodiments 1 and 3, first magnet 6, second magnet 8, first Hall element 10, and second Hall element 12 are disposed aligned with magnetic material 4 in the thickness direction (Z-axis direction) of magnetic material 4 but are not limited to this configuration, and may be disposed aligned with magnetic material 4 in the radial direction of magnetic material 4, for example.

In Embodiments 1 and 3, magnetic material 4 is rotated relative to first magnet 6, second magnet 8, first Hall element 10, and second Hall element 12 but, inversely, first magnet 6, second magnet 8, first Hall element 10, and second Hall element 12 may be rotated relative to magnetic material 4.

In each of the foregoing embodiments, the phase is shifted by ¼ wavelength between the waveform representing the change of the first voltage signal relative to rotation angle θ and the waveform representing the change of the second voltage signal relative to rotation angle θ but are not limited to such a configuration, and the phase may be shifted by, for example, 0 to ½ wavelength. When the shift in phase is not exactly ¼ wavelength (90 degrees), the graph representing the increase/decrease in the value of each of the first voltage signal and the second voltage signal becomes an elliptical graph such as that obtained when the circular graph illustrated in FIG. 9 is squashed obliquely. However, if the complexity of calculation is tolerated, it is possible to detect the rotation direction. When the shift in phase is ½ wavelength (180 degrees), the graph indicating the increase/decrease in the value of each of the first voltage signal and the second voltage signal becomes a straight line graph such as that obtained when the circular graph illustrated in FIG. 9 flattened, and thus becomes a singular point that does not enable detection of rotation direction. When the shift in phase is 1 wavelength (360 degrees), the graph indicating the increase/decrease in the value of each of the first voltage signal and the second voltage signal becomes a straight line graph such as that obtained when the circular graph illustrated in FIG. 9 flattened, and, in addition, the first voltage signal and the second voltage signal plot the same trajectory, and thus becomes a singular point that does not enable detection of rotation direction. Furthermore, even when the largest value and the smallest value of the first voltage signal are different from the largest value and the smallest value of the second voltage signal, respectively, the graph indicating the increase/decrease in the value of each of the first voltage signal and the second voltage signal becomes an elliptical graph such as that obtained when the circular graph illustrated in FIG. 9 is squashed vertically or horizontally.

In place of the shape of magnetic material 4 (4A) described in each of the foregoing embodiments, magnetic material 4 (4A) may be formed, for example, in a shape in which the first magnetic portions and the second magnetic portions are linked alternately like Buddhist prayer beads, and it is sufficient to have a ring-shaped magnetic material in which portions having different cross-sectional areas are formed alternately.

It should be noted that, in Embodiments 1 and 3, in order to reliably detect the rotation amount and the rotation direction of the manipulation component, it is preferable to dispose two Hall elements (first Hall element 10 and second Hall element 12) between two first magnetic portions 18 having a large cross-sectional area.

Hereinbefore, the techniques disclosed in the present disclosure have been exemplified by way of the foregoing embodiments. The enclosed drawings and detailed description are provided for this reason.

Therefore, the elements recited in the enclosed drawings and detailed description may include, aside from elements essential to solving the aforementioned problems, elements not essential to solving the aforementioned problems. As such, the recitation of these non-essential elements in the enclosed drawings and detailed description should not be directly interpreted to mean the non-essential elements are essential.

Furthermore, since the foregoing embodiments are for exemplifying the techniques disclosed in the present disclosure, various modifications, replacements, additions, omissions, etc., can be carried out within the scope of the claims or equivalents thereof.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can be applied to a rotational manipulation detector for detecting rotational manipulation of an manipulation component. Specifically, the present disclosure can be applied to a rotational manipulation detector for detecting rotational manipulation of a focus ring, a zoom ring, or a diaphragm ring of a lens barrel, or a rotational manipulation detector for detecting rotational manipulation of an operation dial in a camera body, for example.

What is claimed is:

1. A rotational manipulation detector, comprising:
a magnetic material in a shape of a ring about a rotational axis, the magnetic material including first magnetic portions and second magnetic portions disposed alternately in a circumferential direction of the magnetic material, the first magnetic portions each having a first cross-sectional area in the circumferential direction, the second magnetic portions each having, in the circumferential direction, a second cross-sectional area different from the first cross-sectional area;
a first magnet disposed opposite to the magnetic material; and
a first magnetic sensor and a second magnetic sensor which are disposed opposite to the magnetic material and detect a change in a magnetic field which occurs when the magnetic material is rotated,
wherein the first magnet, the first magnetic sensor, and the second magnetic sensor are disposed side by side along the circumferential direction of the magnetic material, the first magnet is disposed between the first magnetic sensor and the second magnetic sensor in the circumferential direction of the magnetic material, and
when viewed in a direction of the rotational axis of the magnetic material, the first magnetic sensor and the second magnetic sensor overlap with part of the first magnetic portions.

2. The rotational manipulation detector according to claim 1, wherein
the first magnetic portions project further outward or further inward in a radial direction of the magnetic material than the second magnetic portions, and
in a cross-section perpendicular to the circumferential direction of the magnetic material, the first cross-sectional area is larger than the second cross-sectional area.

3. The rotational manipulation detector according to claim 1, further comprising:
a yoke disposed opposite to the magnetic material, with the first magnet, the first magnetic sensor, and the second magnetic sensor interposed between the yoke and the magnetic material.

4. The rotational manipulation detector according to claim 1, further comprising:
a signal processor that detects a rotation direction and a rotation position of the magnetic material, based on a first detection signal from the first magnetic sensor and a second detection signal from the second magnetic sensor.

5. The rotational manipulation detector according to claim 1, further comprising:
a third magnet disposed opposite to the magnetic material, for providing tactile feedback when the magnetic material is rotationally manipulated, wherein
when viewed from the direction of the rotational axis of the magnetic material, the third magnet is disposed to overlap with part of the first magnetic portions of the magnetic material.

6. A lens barrel, comprising:
the rotational manipulation detector according to claim 1;
at least one lens that moves along an optical axis of the lens barrel; and
an actuator that causes the at least one lens to move according to a rotation direction and a rotation position detected by the rotational manipulation detector.

7. The rotational manipulation detector according to claim 1, wherein
the first magnetic sensor outputs a first waveform for a rotation angle θ of the magnetic material,
the second magnetic sensor outputs a second waveform for the rotation angle θ of the magnetic material, and
the first magnet sensor and the second magnet sensor are disposed side by side along the circumferential direction of the magnetic material to shift phase by ¼ wavelength between the first waveform and the second waveform.

* * * * *